United States Patent [19]
Ogawa

[11] Patent Number: 4,564,782
[45] Date of Patent: Jan. 14, 1986

[54] CERAMIC FILTER USING MULTIPLE THIN PIEZOELECTRIC LAYERS

[75] Inventor: Toshio Ogawa, Kyoto, Japan

[73] Assignee: Murata Manufacturing Co., Ltd., Japan

[21] Appl. No.: 645,301

[22] Filed: Aug. 29, 1984

[30] Foreign Application Priority Data

| Sep. 2, 1983 | [JP] | Japan | 58-162423 |
| Sep. 9, 1983 | [JP] | Japan | 58-167201 |
| Sep. 16, 1983 | [JP] | Japan | 58-171831 |
| Sep. 27, 1983 | [JP] | Japan | 58-179676 |
| Sep. 29, 1983 | [JP] | Japan | 58-182473 |
| Dec. 7, 1983 | [JP] | Japan | 58-232163 |
| Jan. 9, 1984 | [JP] | Japan | 59-2362 |
| Jan. 17, 1984 | [JP] | Japan | 59-6854 |
| Mar. 26, 1984 | [JP] | Japan | 59-43595 |
| Mar. 28, 1984 | [JP] | Japan | 59-61710 |

[51] Int. Cl.$^4$ .................................. H01L 41/08
[52] U.S. Cl. ......................... 310/359; 310/358
[58] Field of Search ................. 310/357-359; 333/187-191

[56] References Cited

U.S. PATENT DOCUMENTS

| Re. 27,116 | 4/1971 | Miller | 310/359 |
| 3,489,931 | 1/1970 | Teaford | 310/359 X |
| 3,562,792 | 2/1971 | Berlincourt et al. | 310/359 X |
| 3,590,287 | 6/1971 | Berlincourt et al. | 310/359 X |
| 4,019,073 | 4/1977 | Visnevsky et al. | 310/359 X |
| 4,087,716 | 5/1978 | Haywang | 310/359 X |

Primary Examiner—Mark O. Budd
Attorney, Agent, or Firm—Ostrolenk, Faber, Gerb & Soffen

[57] ABSTRACT

A ceramic filter including a piezoelectric ceramic and input and output electrode groups disposed within the ceramic body. The input electrode group and the output electrode group extend toward each other from opposing sides of the piezoelectric ceramic. They do not meet, however, and a predetermined spacing, along the thickness dimension of the ceramic, separates the two electrode groups. The input and output electrode groups are each composed of a plurality of electrodes which overlap each other with ceramic layers interposed therebetween.

23 Claims, 52 Drawing Figures

FIG.40
FIG.41
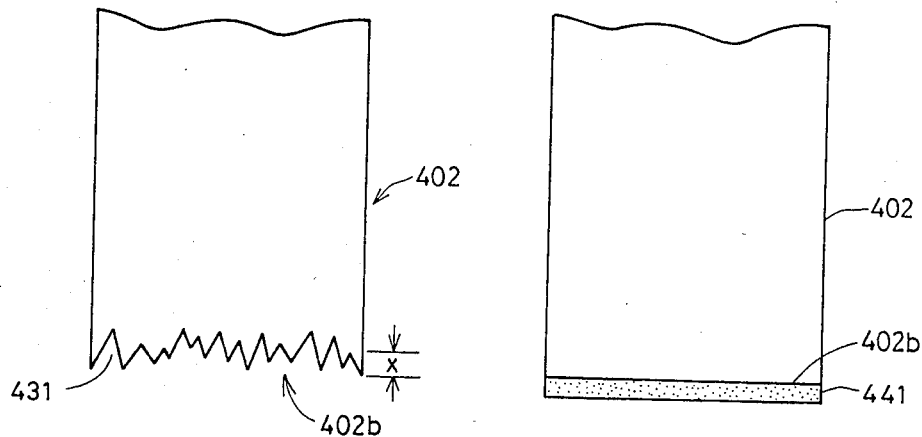
FIG.42
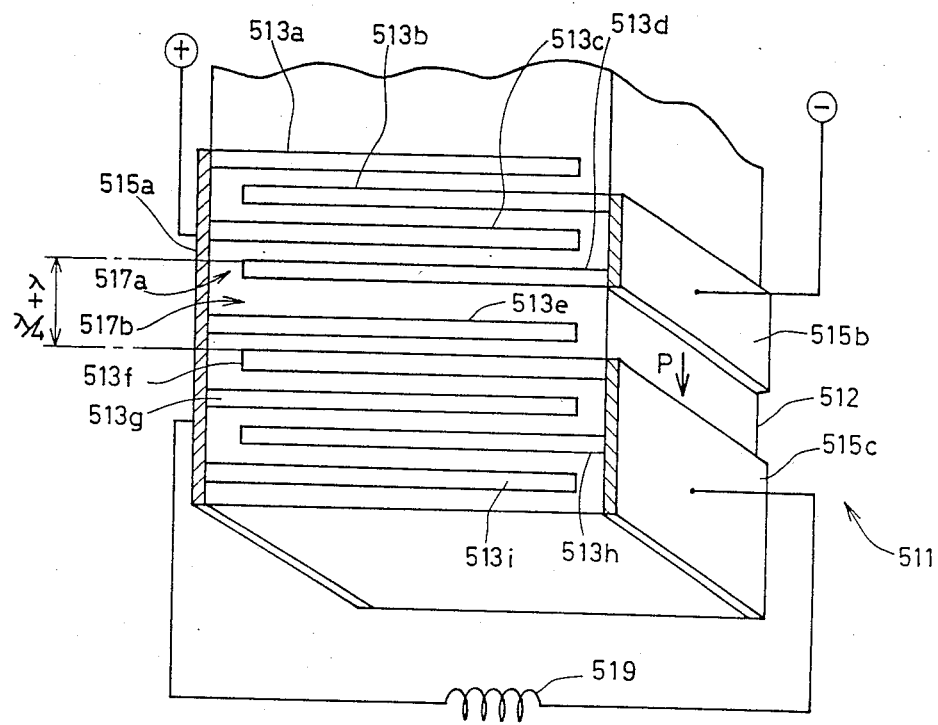

CERAMIC FILTER USING MULTIPLE THIN PIEZOELECTRIC LAYERS

BACKGROUND OF THE INVENTION

1. Field of the Invention

This invention relates to improvements in the construction of a ceramic filter making use of bulk waves wherein within a ceramic, an input electrode group and an output electrode group are spaced a predetermined distance apart from each other and overlap each other in the direction of the thickness of the ceramic.

2. Description of the Prior Art

Japanese Patent-Laying Open Gazette No. 85613/1983 discloses an example of such ceramic filter. The ceramic filter disclosed in said Japanese Patent-Laying Open Gazette No. 85613/1983 is shown in a perspective view in FIG. 1. This multi-layered type ceramic filter 1 comprises a piezoelectric ceramic 2 treated for polarization in the direction of the thickness, i.e., in the P direction, and two electrodes groups 3 and 4 disposed within the piezoelectric ceramics 2.

One electrode group 3 forms an input electrodes group, while the other electrodes group 4 forms an output electrodes group. The electrode groups 3 and 4 are composed of a plurality of interdigital electrodes 3a, 3b, 3c, 3d and 4a, 4b, 4c, 4d, respectively, overlapping each other in the direction of the thickness of the piezoelectric ceramic 2. In the input electrodes group 3, the electrodes 3a and 3c are interconnected and brought out together to the periphery of the ceramic. The other electrodes 3b and 3d are likewise interconnected and routed. This manner of lead-out is also applied to the other electrodes group.

When a voltage is applied across the input electrodes group 3, vibrations are transmitted in the direction of the thickness, i.e., in the vertical direction since the electrodes 3a, 3b, 3c and 3d overlap each other in the direction of the thickness. These vibrations are transmitted to the mechanically coupled electrodes group 4. That is, vertical vibrations produced by the input electrodes group 3 are converted into transverse vibrations which are then transmitted. The transmitted vibrations cause a displacement of acoustic waves in the direction of the thickness of the device, i.e., in the vertical direction in the output electrodes group 4, whereby a voltage is produced. The produced voltage is available the electrodes 4a and 4c and the electrodes 4b and 4d of the output electrodes group 4.

With the conventional multi-layered type ceramic filter 1, where vibrations are transmitted from the input electrodes group 3 to the output electrodes group 4, the direction of displacement is changed twice, as described above, and, consequently, the efficiency of the device is very low. Another drawback is that with the transverse displacement, i.e., transverse effect, an unnecessary spurious vibration is produced in the output waveform.

Japanese Patent-Laying Open Gazette No. 85614/1983 discloses a ceramic filter usable in the high frequency region. FIG. 2 show this ceramic filter in a schematic front view. Within the piezoelectric ceramics 5, two electrodes groups 6 and 7 are disposed. The electrodes group 6 forms an input electrodes group, while the electrodes group 7 forms an output electrodes group. The electrodes groups 6 and 7 are composed of a plurality of electrodes 6a ... 6d and 7a ... 7d, respectively, overlapping each other, the ceramic layers between adjacent electrodes being polarized in opposite directions as indicated by arrows. In the electrodes groups 6 and 7, input and output terminals are connected to the two electrodes 6a and 6d and the two electrodes 7a and 7d, respectively, positioned on the opposite outer sides close to the piezoelectric ceramic surfaces. Because of such construction, a ceramic filter is attained which is capable of effectively suppressing spurious vibrations due to primary resonance.

With the conventional ceramic filter shown in FIG. 2, however, because vibrations are transmitted from the input electrodes group 6 to the output electrodes group 7, since the direction of displacement is changed twice, and the efficiency remains is very low. Another drawback is that with the transverse displacement, i.e., transverse effect, an unnecessary spurious vibration is produced in the output waveform.

SUMMARY OF THE INVENTION

Accordingly, a principal object of this invention is to provide a ceramic filter which eliminates the previously discussed drawbacks of prior art ceramic devices by being highly efficient and by producing a minimum of unnecessary spurious vibrations.

According to a broad aspect of this invention, there is provided a ceramic filter making use of bulk waves and comprising a piezoelectric ceramic, and an input electrode group of an output electrode group which are spaced a predetermined distance within the ceramic layers in the direction of the thickness and overlap each other. Each input and output electrode groups include a plurality of internal electrodes which overlap each other in the direction of the thickness of the ceramic layers which separate adjacent electrodes. The electrode arrangement is such that vibrations produced by a voltage applied across the input electrodes group are propagated in the direction of the thickness of the ceramics to reach the output electrodes group, whereby an output is derived from the output electrodes group.

Because of the arrangement described above, no change of direction of vibration is made in this invention and hence the efficiency is increased and since the vibrations are trapped in the ceramics, it is possible to provide a ceramic filter suitable for use as a chip component.

The ceramic layers may be polarized uniformly in one direction or preferably, in order to increase the efficiency of trapping vibration energy, only part of the ceramic may be polarized. Further, in the plurality of internal electrode portions, each ceramic layer between adjacent internal electrodes may be polarized so that adjacent ceramic layers are polarized in opposite directions along the direction of the thickness. Further, an arrangement may be made wherein each internal electrode consists of a plurality of divisional electrodes and first and second adjacent electrodes in the divisional electrodes are opposed at least partly to a third electrode adjacent thereto through another ceramic layer.

Further, the piezoelectric ceramic may be polarized in the direction at right angles to the direction of the thickness, in which case thickness shear vibrations are utilized.

These objects and other objects, features, aspects and advantages of the present invention will become more apparent from the following detailed description of the present invention taken in conjunction with the accompanying drawings.

BRIEF DESCRIPTION OF THE DRAWINGS

FIG. 40 is a fragmentary front view for explaining a twelfth embodiment of this invention;

FIG. 41 is a fragmentary front view for explaining a thirteenth embodiment of this invention;

FIG. 42 is a fragmentary perspective view of a fourteenth embodiment of this invention;

DESCRIPTION OF THE PREFERRED EMBODIMENTS

Figure 3:
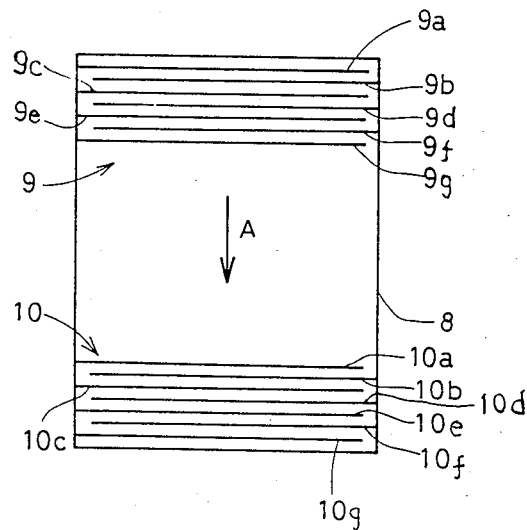
FIG. 3 is a schematic structural view for explaining the principle of this invention.

FIG. 3 is a schematic sectional view for explaining the principle of the invention. According to the invention, within a piezoelectric ceramic 8, an input electrode group 9 and an output electrodes group 10 are spaced a predetermined distance apart from each other in the direction of the thickness and overlap each other.

The input and output electrodes groups 9 and 10 are respectively composed of a plurality of internal electrodes $9a \ldots 9g$ and $10a \ldots 10g$, overlapping each other in the direction of the thickness of the ceramic 8 through its many ceramic layers. As a result of such arrangement, according to the invention, bulk waves produced by a voltage applied across the input electrodes group 9 are propagated in the direction of the thickness as indicated by arrow A to reach the output electrodes group 10, whereby an output is derived from the output electrodes group 10.

Figure 1:
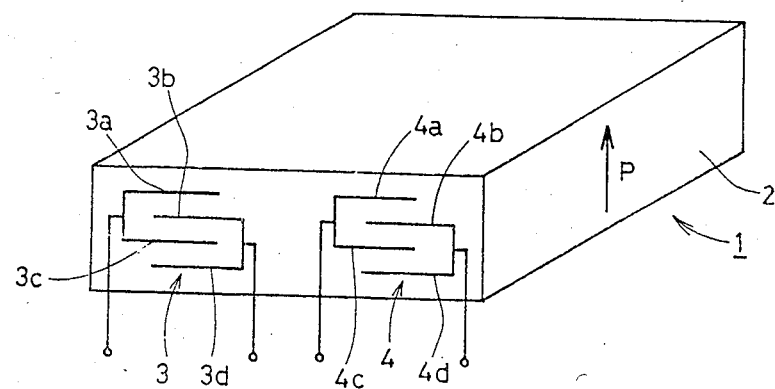
FIG. 1 is a perspective view showing a prior art example of a conventional multi-layered type ceramic filter.
Figure 2:
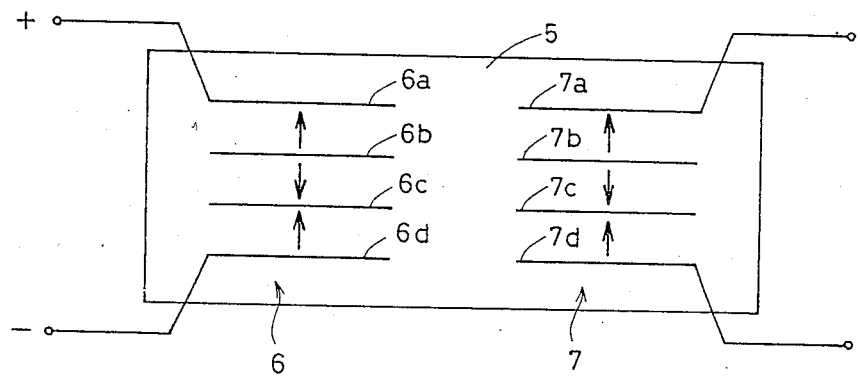
FIG. 2 is a schematic structural view showing another example of a conventional multi-layered type ceramic filter.

Since bulk waves vibrating in the direction of the thickness propagate as such in the direction of the thickness and are interrupted by the output electrode group 10, there is no change of direction in the accoustical vibrations as in the conventional ceramic filters shown in FIGS. 1 and 2. Therefore, a highly efficient filter is realized. The details of each embodiment will now be described.

Figure 4:
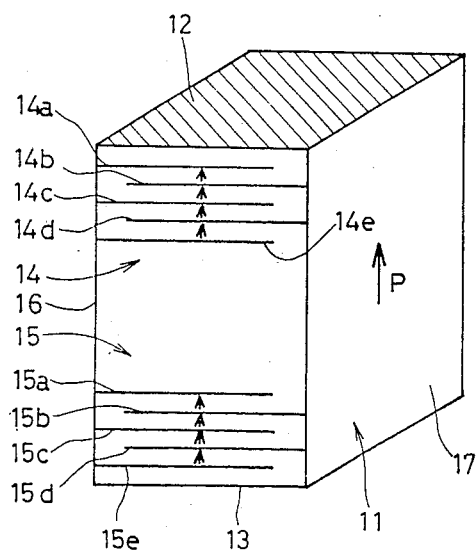
FIG. 4 is a perspective view showing a ceramics used in a first embodiment of this invention.

FIG. 4 is a perspective view showing a multi-layered type piezoelectric ceramic used in a first embodiment of this invention. The multi-layered type ceramics 11 is formed by applying an internal electrode forming paste to a number of ceramic green sheets and firing them together. Examples of piezoelectric ceramic materials are lead zirconate titanate, lead titanate, barium titanate and other substances which can modify the previous materials.

Examples of the internal electrode forming pastes are palladium, silver-palladium alloy and other high-melting metals and alloys. In this embodiment, a composition of $Pb_{0.85}La_{0.1}TiO_3 + 0.5$ wt. % $MnO_2$ was used as the piezoelectric ceramic material.

The ceramic green sheets are constructed by mixing calcinated powder of the aforesaid composition with a binder and shaping the mixture by the doctor blade method. The ceramic green sheets thus obtained are used for applying thereon, by a printing method, palladium paste for forming internal electrodes. They are then pressed together and sintered at 1200° C. for two hours, whereby a multi-layered type ceramic 11 is obtained.

Subsequently, polarization electrodes 12 and 13 are formed on the upper and lower surfaces of the multi-layered type ceramic 11. Then the ceramic 11 is subjected to a polarization treatment so that it is polarized in the direction of its thickness, i.e., in the direction of arrow P. As is seen from FIG. 4, the internal electrodes are divided into two electrode groups 14 and 15. The electrode groups 14 and 15, in this embodiment, comprise five electrodes 14a . . . 14e and 15a . . . 15e, respectively. The distance between adjacent electrodes is 200 $\mu$m. Further, the distance between the electrode groups 14 and 15, i.e., between the electrodes 14e and 15a is 1 mm according to the presently shown embodiment of the invention. As is clear from FIG. 4, the electrodes 14a . . . 14e and 15a . . . 15e of the electrodes groups 14 and 15 are alternately led out to the lateral surfaces 16 and 17. Therefore, the electrodes 14a . . . 14e and 15a . . . 15e are in the form of interdigital electrodes.

Subsequently, the lateral surfaces 16 and 17 of the piezoelectric ceramic 11 are formed with input electrodes 21 and 22 and output electrodes 23 and 24, whereby an embodiment of this invention is obtained, as shown in a perspective view in FIG. 5. In this case, the electrode group 14 forms the input electrodes group, while the electrodes group 15 forms the output electrodes group, but it is understood that the electrodes group 14 may be used as the output electrodes when the electrode group 15 are the input electrodes.

In this embodiment, when a voltage is applied across the input external electrodes 21 and 22, the input electrode group 14 is vibrated along of the thickness of the device and elastic waves due to these vibrations are transmitted through the multi-layered type ceramic 11 to the output electrodes group 15. The electrodes 15a . . . 15e of the output electrodes group 15 vibrate as a result and an output is generated at the output external electrodes 23 and 24 which are connected to the output electrode group 15.

Because there is no change of direction in the acoustic wave as in the conventional multi-layered type ceramic filter, the illustrated multi-layered type ceramic filter, according to the invention, is highly efficient. Similarly, since no unnecessary vibrations due to transverse effects occur, spurious outputs are reduced. Further, in the electrode groups 14 and 15 of the multi-layered type ceramics 11, the vibrations are trapped in the bulk centered at a region where the electrodes 14a–14e and the electrodes 15a–15e overlap each other, so that the lateral surfaces 16 and 17 can be fixed and hence a chip component can be easily made.

Further, in this embodiment, the frequency pass band can be easily changed without changing the ceramic material. That is, by changing the thickness of green sheets in forming the multi-layered type ceramic 11, the interelectrode distance can be changed and hence the frequency of sound waves allowed to pass can be changed.

Let "v" be the sound velocity, "f" be the frequency of sound waves that propagate through, "λ" be the wave length, and "t" the thickness of each layer, then the relation holds:

$$v = f\lambda = f \cdot 2t$$

Thus, if the sound velocity is constant, then the frequency "f" can be changed by changing the thickness "t". The sound velocity of the bulk waves of this material system is about 5200 m/sec. Further, by changing the distance between the electrode groups 14 and 15 in FIG. 5, it is very easy to change the delay time between input and output electrodes so that the assembly can be used as a delay element.

Other embodiments of the present invention will now be described in connection with actual data obtained in reducing the invention to practice.

Figure 5:
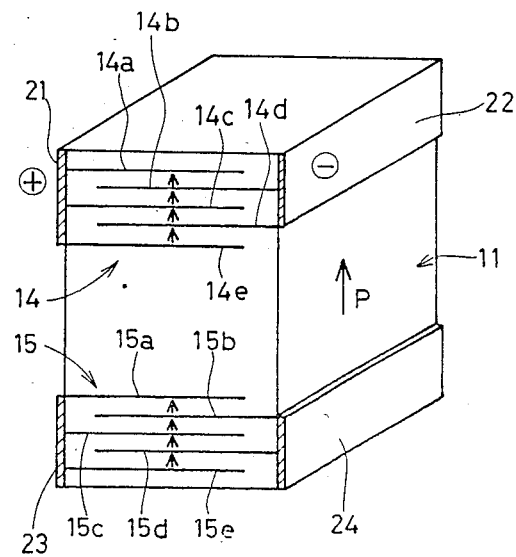
FIG. 5 is a perspective view showing the first embodiment using the ceramic shown in FIG. 4.
Figure 6:
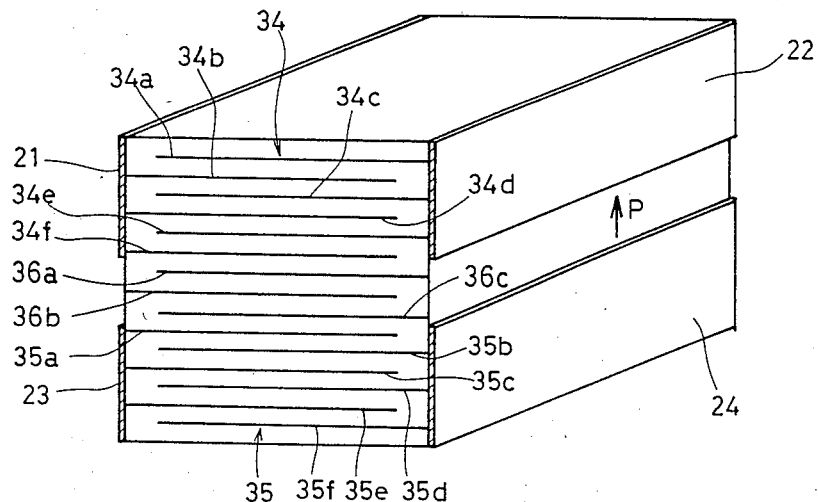
FIG. 6 is a perspective view showing a second embodiment of this invention.

FIG. 6 is a perspective view showing a second embodiment of the invention. In this case, one electrode group 34 and another electrode group 35 include composed of six electrodes 34a . . . 34f and 35a . . . 35f, respectively, with electrodes 36a, 36b, and 36c formed between the electrode groups 34 and 35. The electrode groups 34 and 35 are formed with external electrodes 21, 22, 23, and 24, as in the case of the embodiment shown in FIG. 5. Thus, in the embodiment shown in FIG. 6, since the electrode groups 34 and 35 comprise six electrodes 34a . . . 34f and 35a . . . 34f, respectively, the number of electrode pairs, n, is:

$$2n + 1 = 6$$

Figure 8:
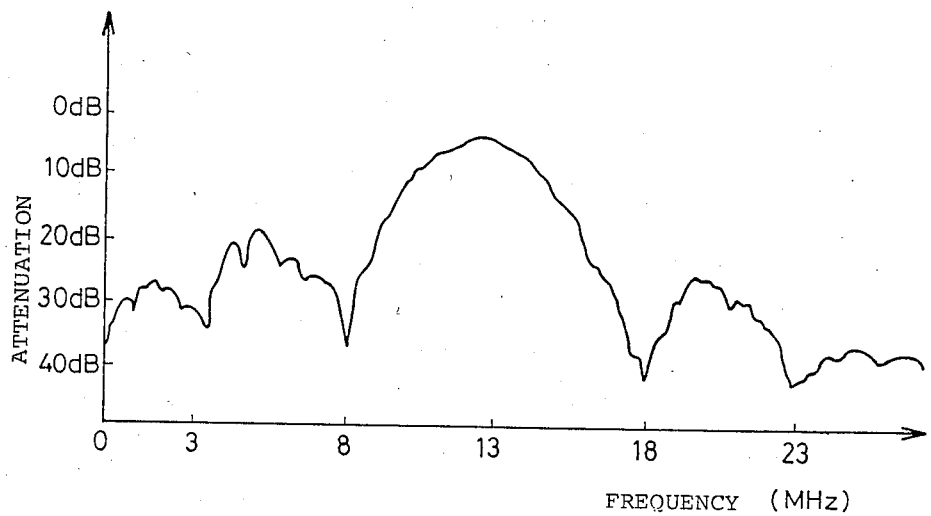
FIG. 8 is a graph showing the frequency characteristic of the embodiment shown in FIG. 6.

Thus, n=2.5. The frequency characteristic of this embodiment is shown in FIG. 8. As is clear from FIG. 8, the spurious level is low.

Figure 7:
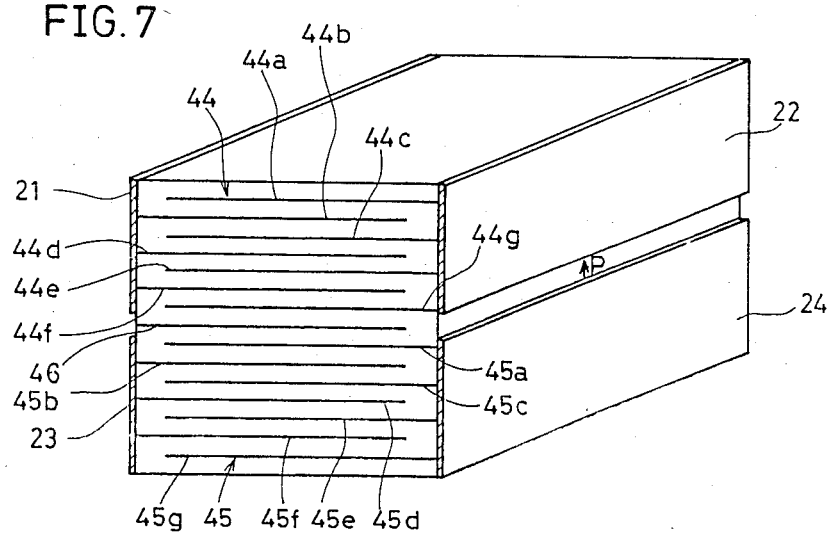
FIG. 7 is a perspective view showing a third embodiment of this invention.

FIG. 7 is a perspective view showing a third embodiment of this invention. In this case, the electrode groups 44 and 45 are composed of seven electrodes 44a . . . 44g and 45a . . . 45g, respectively, with a single electrode 46 is disposed between the electrodes groups 44 and 45. Thus, this embodiment differs from the one shown in FIG. 6 only in the number of electrodes. The rest of the arrangement is the same. In this case, since the electrodes groups 44 and 45 include seven electrodes 44a ... 44g and 45a ... 45g, respectively, if follows from 2n+1=7 that the number it electrode pairs, n, is 3.

Figure 9:
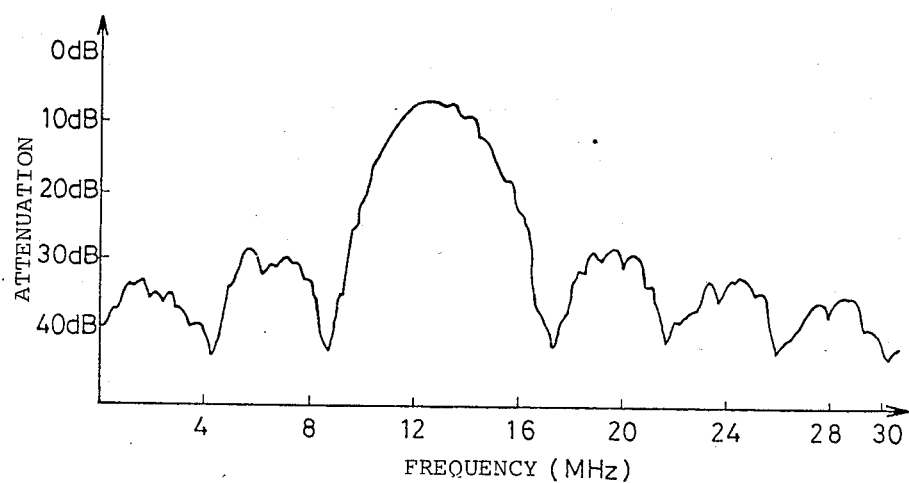
FIG. 9 is a graph showing the frequency characteristic of the embodiment shown in FIG. 7.

The frequency characteristic of the embodiment shown in FIG. 7 is shown in FIG. 9. A comparison between the frequency characteristics shown in FIGS. 9 and 8 indicates that the width of pass band can be easily changed by changing the number of electrode pairs.

As is clear from the second and third embodiments, of the invention, the electrodes 36a ... 36c, and 46 which are not connected to the external electrodes are not formed at each electrodes group, and no electrodes may be formed between the electrode groups 14 and 15 of the embodiment shown in FIG. 5.

Further, in order to suppress the reflection of induced bulk waves at the end surfaces (e.g., 12 and 13 in FIG. 4), the end surfaces are provided at positions remote from the electrodes groups. The end surfaces are formed with undulations equal to or greater than the wave length or the interelectrode distance in the electrodes groups. Alternately the end surfaces are inclined with respect to the electrodes, whereby the spurious component is reduced.

Figure 10:
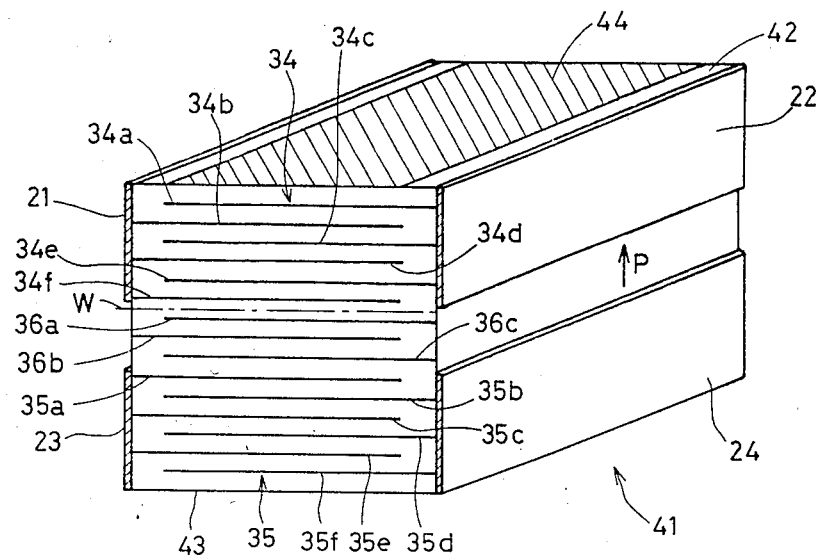
FIG. 10 is a perspective view showing a fourth embodiment of this invention, wherein the ceramic layers are partially polarized.

FIG. 10 is a perspective view showing a ceramic filter 41 according to a fourth embodiment of this invention. The ceramic filter 41 of this embodiment has almost the same arrangement as the one shown in FIG. 6. Thus, correspondingly identical parts are marked with corresponding reference numerals, and will not be described.

The ceramic filter 41 of this embodiment is characterized in that the piezoelectric ceramic is subjected only partially, but not totally, to a polarization treatment. That is, by forming the polarization electrodes on only a portion of the end surfaces of the piezoelectric ceramics aligned in the direction of the thickness, (for example, a shaded portion 44) (and a similar portion, not shown, on the end surface 43), and by effecting polarization, the ceramic portion between the overlapping portions of the polarization electrodes is polarized.

In the example of FIG. 10, the width of the polarization electrodes, as shown at a shaded portion 44, is the same as the width of the overlapping portions of the internal electrodes 34a ... 34f and 35a ... 35f forming the input and output electrodes groups and hence the ceramics between the overlapping portion of the internal electrodes is polarized. Thus, since only the ceramics between the overlapping portion of the internal electrodes is vibrated, trapping efficiency of thickness vibration can be fully increased, with the result that it becomes possible to obtain a response having less spurious vibrations.

Figure 11:
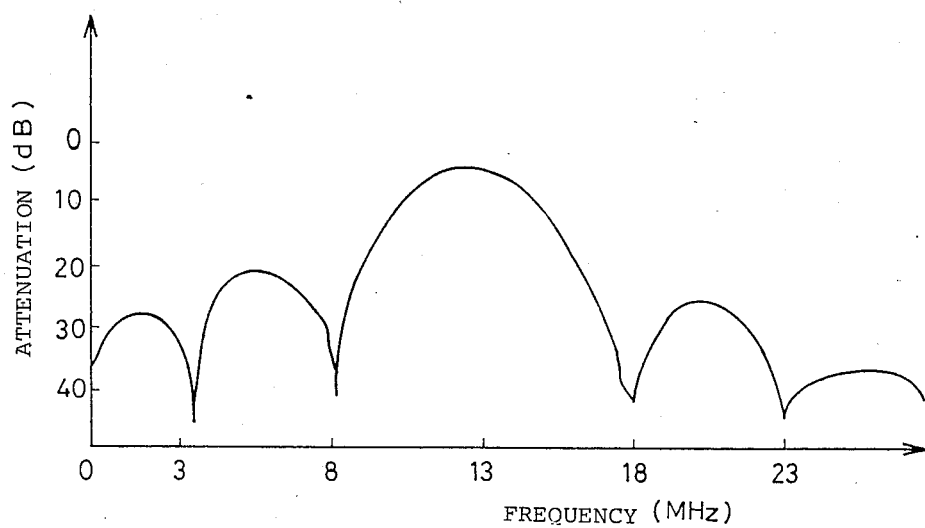
FIG. 11 is a graph showing the frequency characteristic of the embodiment shown in FIG. 10.

FIG. 11 shows the attenuation-frequency characteristic of the ceramic filter shown in FIG. 10. When FIG. 11 is compared with FIG. 8 which shows the characteristic of the embodiment shown in FIG. 6, it can be seen that the ceramic filter of the embodiment shown in FIG. 10 provides an improved response. That the vibration envelope is smooth because spurious output are suppressed in the pass band region.

In addition, in the embodiment shown in FIG. 10, it is preferred that only the portions between the overlapping portions of the internal electrodes 34a ... 34f and 35a ... 35f be treated for polarization. It is pointed out, however, that it cannot be avoided that the portion to be treated for polarization extends somewhat.

Figure 12:
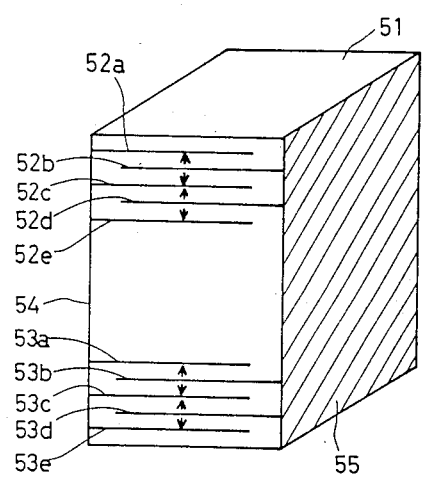
FIG. 12 is a perspective view showing a piezoelectric ceramics used in a fifth embodiment of this invention.

FIG. 12 is a perspective view showing a ceramic filter according to a fifth embodiment of this invention. In this case, the right and left lateral surfaces of a piezoelectric ceramics 51 formed with internal electrodes 52a ... 52e and 53a ... 53e are formed with polarization electrodes 54 and 55, and polarization treatment is applied thereto. With polarization treatment, as shown in FIG. 12, the ceramic layers between the internal electrodes 52a ... 52e and 53a ... 53e are polarized in opposite directions, as indicated by arrows.

Figure 13:
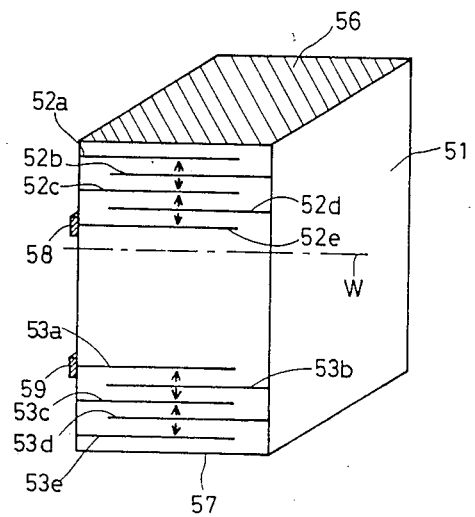
FIG. 13 is a perspective view showing the ceramic filter of the fifth embodiment of this invention including the piezoelectric ceramics shown in FIG. 12.

Subsequently, as shown in FIG. 13, the upper and lower surfaces of the piezoelectric ceramic 51 are formed with electrodes 56 and 57. The electrodes 56 and 57 parallelly overlap a plurality of internal electrodes 52a ... 52e and 53a ... 53e. Thus, the electrode 56 and electrodes 52a through 52e form one electrode group, while the electrodes 53a through 53e and electrode 57 form another electrode group. Thereafter, the polarization electrodes 54 and 55 are removed by cutting or grinding, and external electrodes 58 and 59 for contacting the electrodes 52e and 53e are formed on one lateral surface of the ceramics 51. As shown in FIG. 13, the ceramic filter, wherein the electrodes are connected in series, can be obtained.

In the embodiment shown in FIG. 13, if the upper electrode group is the input electrode group, a voltage will be applied across the electrode 56 and internal electrode 52e. Thereby, vibrations are produced at the upper electrode group in the vertical direction of the thickness and propagate within the piezoelectric ceramics 51 to reach the lower electrode group, so that an output is derived from the electrode 57 and internal electrode 53e. Thus, since there is no change of direction of displacement involved in contrast to the case of the conventional ceramic filter shown in FIG. 2, it is seen that a highly efficient ceramic filter can be attained.

Figure 14:
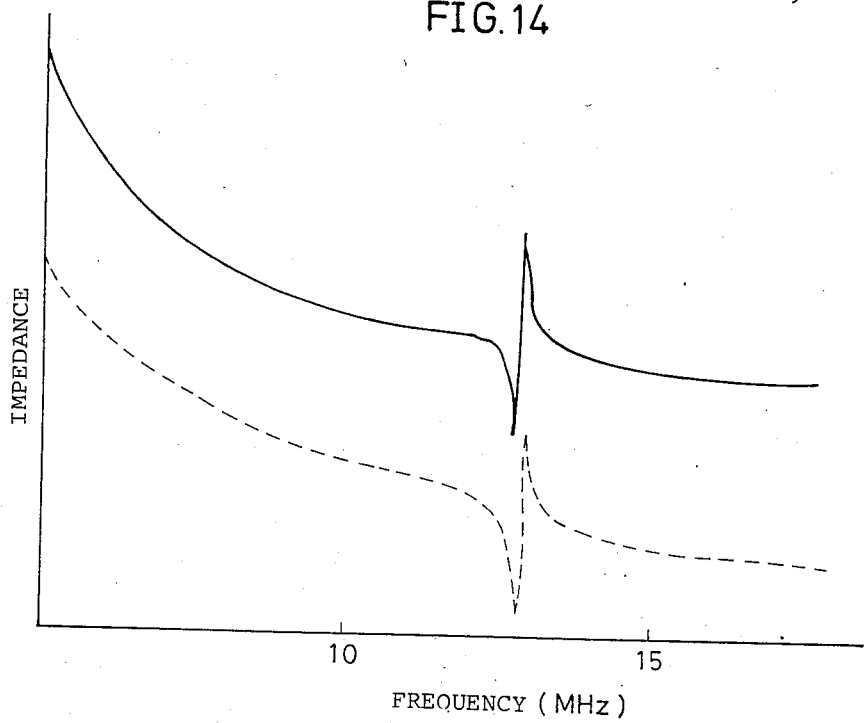
FIG. 14 is a graph showing the impedance-frequency characteristic of the piezoelectric filter in the embodiment shown in FIG. 13.
Figure 15:
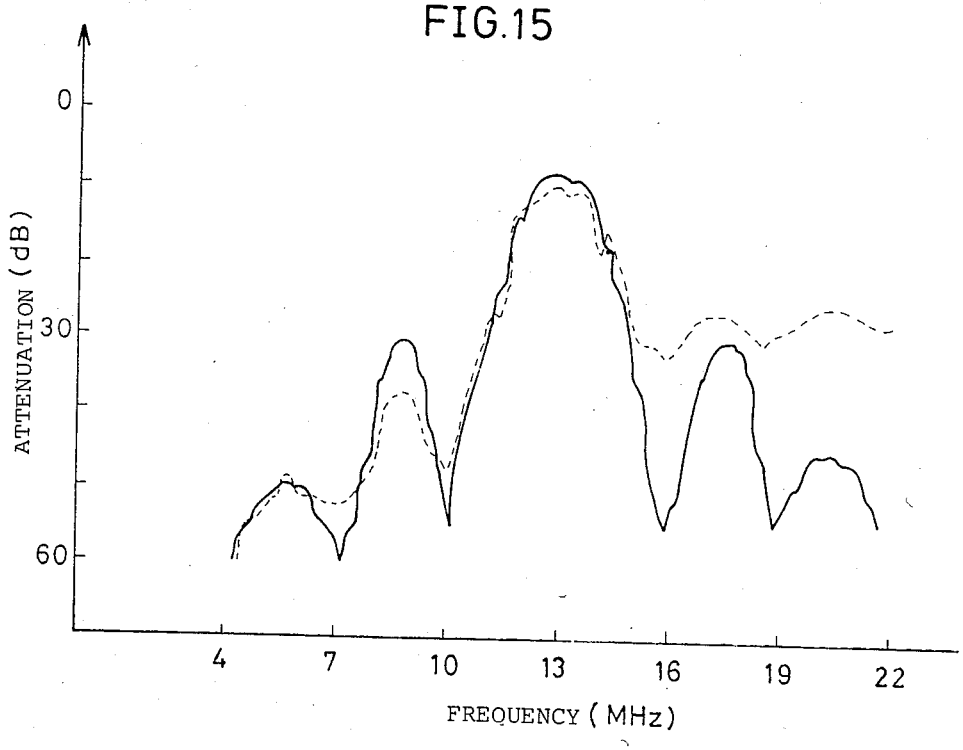
FIG. 15 is a graph showing the attenuation-frequency characteristic of the embodiment shown in FIG. 13.

Similarly, since undesired vibrations attendant on transverse effect are not produced, the spurious level is also very low. Further, since only the electrodes 56, 52e, 53a, and 57 positioned on opposite outer sides of the electrodes groups among the electrodes 56, 52a ... 52e, 57, and 53a ... 53e forming the electrodes groups are led out, the electrodes are not connected in parallel as in the conventional ceramic filter shown in FIG. 1. Thus, even if the number of electrodes is increased to utilized vibration modes in a higher frequency region, sharp decreases in impedance can be avoided and no problem of impedance matching is incountered. The impedance-frequency characteristic and attenuation-frequency characteristic of the embodiment shown in FIG. 13 are shown in FIGS. 14 and 15. In addition, for comparison purposes, the characteristics of a ceramic filter of the type in which the internal electrodes are connected in parallel are shown in broken lines in FIGS. 14 and 15. The number of electrode pairs, n, in the embodiment shown in FIG. 13 is 4.5 as computed from $2n+1=10$.

Figure 16:
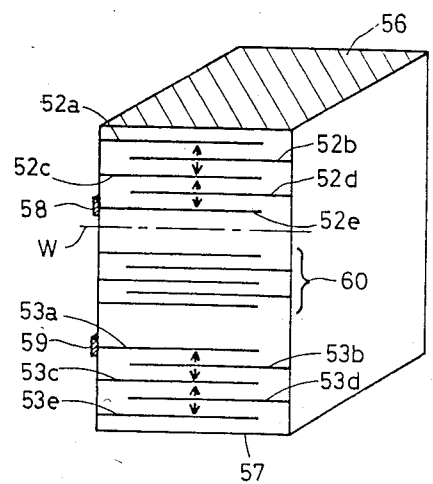
FIG. 16 is a perspective view of a sixth embodiment of this invention.

FIG. 16 is a perspective view showing a sixth embodiment of the invention. In the present embodiment, in addition to the configuration of the embodiment shown in FIG. 13, one or more internal electrodes 60 are formed between the input and output electrodes groups. In this way, one or more internal electrodes 60 may be formed between the input and output electrode groups. Thus, the ceramic filter shown in FIG. 16 can be obtained by preparing a piezoelectric ceramic with a number of internal electrodes arranged in parallel overlapping relation, and utilizing part of the internal electrodes to form two electrodes groups. That is, two electrodes including a number of ceramic layers partitioned by the internal electrodes are connected to the outside, whereby an electrode group can be formed. Further, if the internal electrodes 60 shown in FIG. 16 are grounded, the stray capacity is decreased.

FIGS. 17 through 26 collectively illustrate a seventh embodiment of the invention. The ceramic filter in this embodiment is intended to increase impedance as in the ceramic filters of the fifth and sixth embodiments described above.

Figure 17:
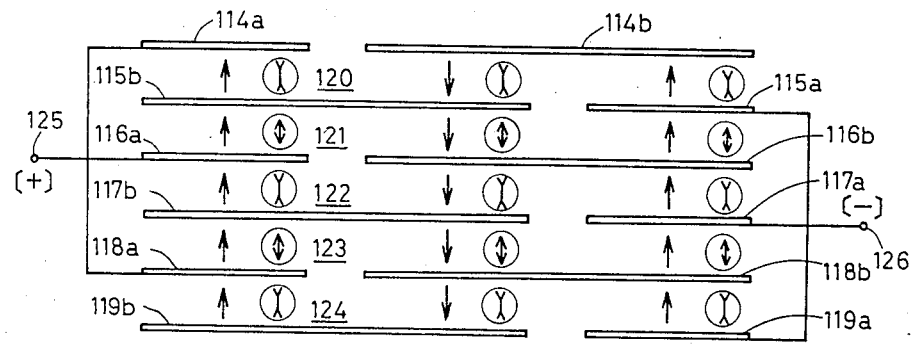
FIG. 17 is a schematic sectional view for explaining the arrangement of one electrodes group in a seventh embodiment of this invention.

FIG. 17 is a sectional view schematically showing one of the input and output electrode groups in the seventh embodiment of the invention. In FIG. 17, the internal electrodes 114a ... 119a and 114b ... 119b overlap each other in the direction of thickness and are formed in three or more layers, e.g., six layers. Between these layers of electrodes, piezoelectric ceramic layers 120 ... 124 are interposed. The piezoelectric ceramic layers 120 ... 124 are constructed by sintering when the layers are sintered with the electrodes 115a ... 118a and 115b ... 118b disposed therebetween.

The formation of the ceramic layers and internal electrodes involves the same materials and methods as used in the first embodiment described above with reference to FIGS. 4 and 5. If the electrodes 114a, 114b, 119a, and 119b positioned on the outermost sides are made of palladium or silver-palladium alloy, they would be easily oxidized when subjected to high temperatures and the resistance would rise. Thus, though not shown, it is preferable that ceramic layers be formed to cover the electrodes 114a, 114b, 119a, 119b before firing or that after firing, the electrodes 114a, 114b, 119a, and 119b be formed by baking thereon silver paste, for example.

As described above, external terminals 125 and 126 are connected to the electrodes of the respective layers. External terminal 125 is connected to the electrodes 114a, 116a, and 118a, while external terminal 126 is connected to the electrodes 115a, 117a, and 119a.

The presently discussed embodiment is characterized in that the electrodes positioned at layers which include the electrodes which are externally connected are referred to as divisional electrodes. In this embodiment, the electrodes connected to the external electrodes are the electrodes 114a through 119a, and what is referred to as the electrodes positioned at the layers along which these electrodes extend includes all the electrodes, and hence it follows that all the electrodes are divisional electrodes. For example, the electrodes 114a and 114b are divisional electrodes.

Further, the seventh embodiment is also characterized in that, first and second adjoining electrodes, of the divisional electrodes, are separated at least partially, by a third electrode which extends through a piezoelectric ceramic layer. The first and second adjoining electrodes are, for example, the electrodes 114a and 114b, and the third electrode is the electrode 115b. These first, second, and third electrodes are relatively determined; thus, if the electrodes 115a and 115b are the first and second electrodes, then the third electrode is the aforesaid electrode 114b, and at the same time since the electrode 116b lies oppositely at least partly, to the electrodes 115a and 115b through a piezoelectric ceramic layer 121, it may be said to be the third electrode.

Because of the aforesaid arrangement, the successive connection of the first electrode, piezoelectric ceramic layer, third electrode, piezoelectric ceramic layer, and second electrode forms a series-connected capacitor forming part. The ceramic layer as such has a dielectric characteristic and a piezoelectric characteristic. Thus capacitance is derived from the ceramic layer between electrodes. Therefore, the term "capacitor forming part" as used herein means a part having a dielectric capacitance. The relationship between the various parts of the aforesaid arrangement will now be described with reference to a particular portion of the embodiment as an example.

The electrode 114a, (first electrode), piezoelectric ceramic layer 120, electrode 115b (third electrode), piezoelectric ceramic layer 120, and electrode 114b (second electrode) are successively connected to form a series-connected capacitor forming part. In addition, in this embodiment, further connected to the electrode 114b serving as the third electrodes are the piezoelectric ceramic layer 120 and electrode 115a.

In this embodiment, the piezoelectric layers are treated to be polarized in the direction of their thickness. Further, this embodiment is characterized in that the portion positioned between the first and third electrodes and the portion positioned between the second and third electrodes are mutually oppositely polarized. More particularly, the piezoelectric ceramic layers 120 through 124 are polarized in the direction of the thickness. Focusing on ceramic layer 120, for example, it is seen that the portion positioned between the electrode 114a (first electrode) and the electrode 115b (third electrode) is in the direction of an arrow opposite to the portion positioned between the electrode 114b (second electrode) and the electrode 115b (third electrode); thus, these portions are mutually oppositely polarized.

If an electric field is applied across the external terminals 125 and 126 so that, for example, as shown in FIG. 7, the external terminal 125 is at a positive potential and the external terminal 126 is at a negative potential, all the portions in the piezoelectric ceramic layers 120, 122, and 124 are contracted (squeezed together), while all the portions in the piezoelectric ceramic layers 121 and 123 are expanded. That is, mutually opposite vibration displacements appear in the piezoelectric ceramic layers on the opposite sides of any one layer of electrode. And since for example three series-connected capacitors are formed between the external terminals 125 and 126, the capacity is lowered and the impedance is increased.

Figure 18:
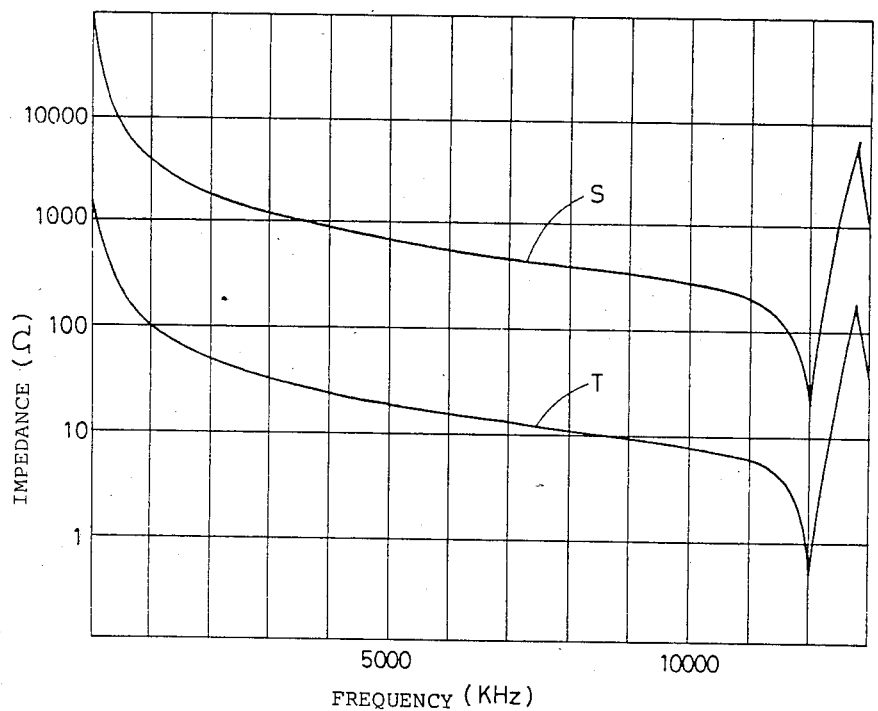
FIG. 18 is a graph showing the frequency-impedance characteristic of the resonator shown in FIG. 17.

FIG. 18 shows the frequency-impedance characteristic of the arrangement shown in FIG. 17. It can be observed that the curve S indicating the characteristic of the embodiment of FIG. 17 is greater in impedance than the curve T indicating the characteristic of an arrangement having no divisional electrodes.

Figure 19:
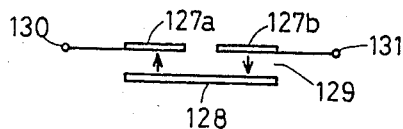
FIGS. 19 and 20 are schematic views showing modifications of the seventh embodiment of this invention, wherein the number of capacitors connected in series between the internal electrodes is altered.
Figure 20:
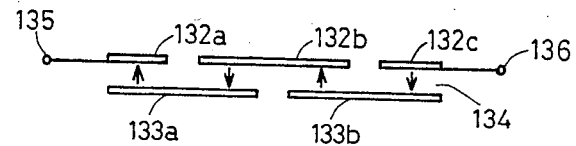

FIGS. 19 and 20 show modifications of the seventh embodiment, which differ from the foregoing example in the number of series-connected capacitors. In addition, in FIGS. 19 and 20, two layers of electrodes and one intervening piezoelectric ceramic layer appear.

In FIG. 19, two electrodes 127a and 127b forming one layer, one electrode 128 forming another layer, and a piezoelectric ceramic layer 129 interposed therebetween are shown. External terminals 130 and 131 are connected to the electrodes 127a and 127b, respectively. Arrows shown in the piezoelectric ceramic layer 129 indicate the direction of polarization. In this embodiment, the electrodes to be connected to the external terminals 130 and 131 are the electrodes 127a and 127b, which are, therefore, divisional electrodes. Thus, the electrode 129a corresponds to the first electrode, the electrode 127b corresponds to the second electrode, and the electrode 128 corresponds to the third electrode. In addition, the electrode 128 having no external terminal connected thereto is not a divisional electrode.

In FIG. 20, four series-connected capacitors are formed. In this embodiment, three electrodes 132a, 132b, and 132c form one layer, while two electrodes 133a and 133b form another layer, with a piezoelectric ceramic layer 134 interposed therebetween. Arrows shown in the piezoelectric ceramic layer 134 indicate the direction of polarization. The electrode 132a has an external terminal 135 connected thereto, while the electrode 132c has an external terminal 136 connected thereto. The electrodes positioned at the layer where the electrodes, which have the external terminal 135 and 136 connected thereto, extend are divisional electrodes, as are electrodes 132a, 132b, and 132c. In this embodiment, the electrodes 133a and 133b, which are not connected to the external terminals, are also divisional electrodes. There is no contradiction here because there is no stipulation that electrodes not connected to external terminals are not divisional electrodes.

In the embodiments of FIGS. 19 and 20, the number of series-connected capacitors is arbitrary and may be selected in connection with a desired impedance value.

The method for creating the polarization in the product and the external terminal forming method in the actual production of the structure shown in FIG. 17 will now be described.

As shown in FIG. 17, the piezoelectric ceramic layers 120 . . . 125 differently configured and vary in accordance with their position in the direction of polarization. Thus, after sintering, the procedure of simply applying a high DC electric field is not sufficient to obtain such polarized state. For this reason, the following methods are used.

Figure 21:
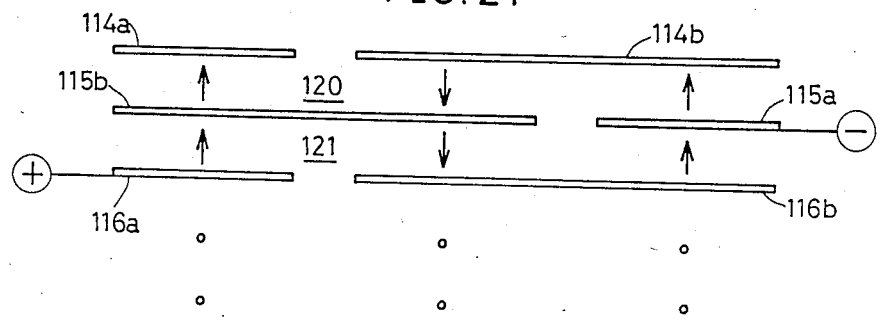
FIG. 21 is a schematic sectional view showing a first example of the method of polarizing the piezoelectric ceramics in the seventh embodiment of this invention.

In FIG. 21, a polarization method for each piezoelectric ceramic layer is shown. For example, when a piezoelectric ceramic layer 121 is treated to polarize it, a positive potential is applied to electrode 116a and a negative potential is applied to electrode 115a, so that an electric field is applied successively to the electrodes 116a, 115b, 116b, and 115a, to create polarization in opposite directions.

Figure 22:
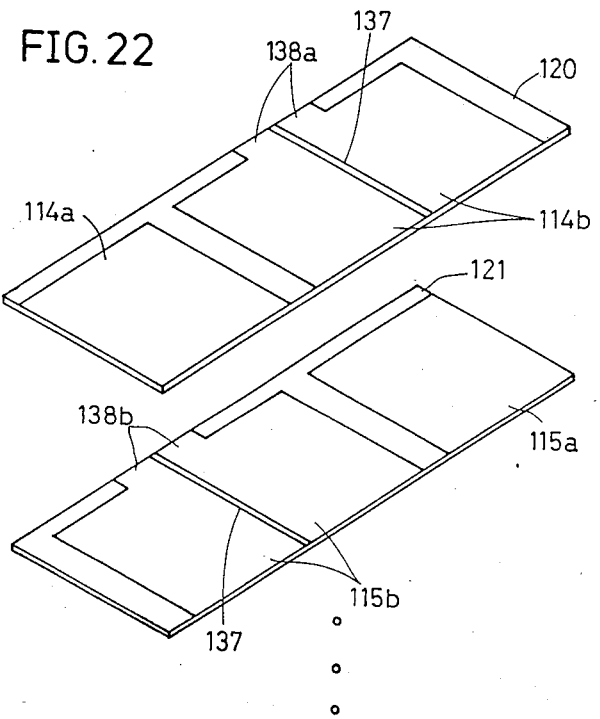
FIGS. 22 through 25 are views showing a second example of the method of polarizing the piezoelectric ceramics according to this invention, and schematically showing the step of obtaining one electrodes group.

Another possible method, as shown in FIG. 22, is to form slits in electrodes positioned oppositely to two electrodes through one piezoelectric ceramic layer in order to separate the electrodes. In the range shown in FIG. 22, the electrodes 114b and 115b are formed with slits 137. At ends of the electrodes 114b and 115b adjacent the slit 137 are lead-out portions 138a and 138b extending to an edge end of the piezoelectric ceramic layer 120 or 121. Such arrangement is also employed in the other electrodes.

Figure 23:
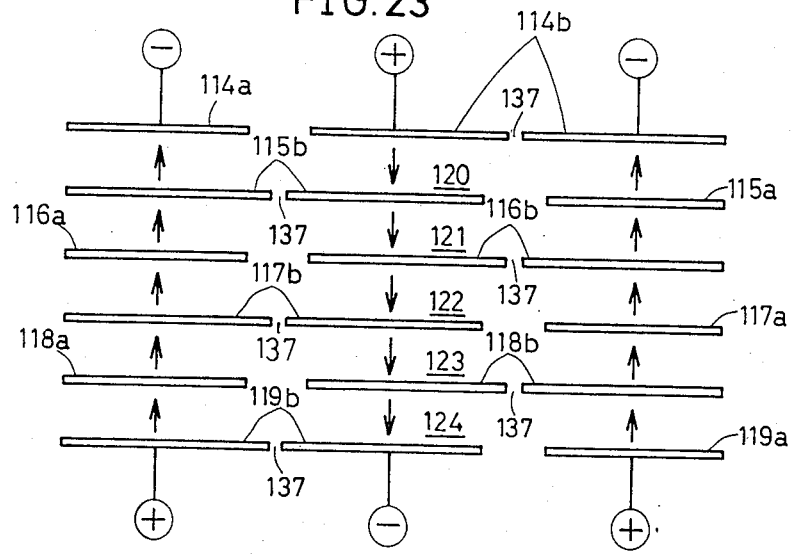

FIG. 23 shows the relationship between the electrodes where the electrodes shown in FIG. 22 are stacked. As seen at FIG. 23, three separate sets of electrodes are arranged in the direction of the thickness. Thus, if a voltage shown in FIG. 23 is applied to each electrode groups, the piezoelectric ceramic layers 120 . . . 124 are polarized in the direction indicated by arrows.

Figure 24:
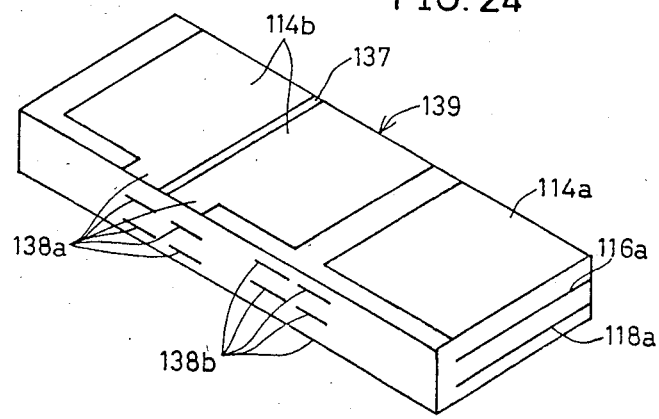

In FIG. 24, the external appearance of the sintered body 139 after it is polarized with the electrode groups illustrated in FIG. 23 is shown in perspective.

Figure 25:
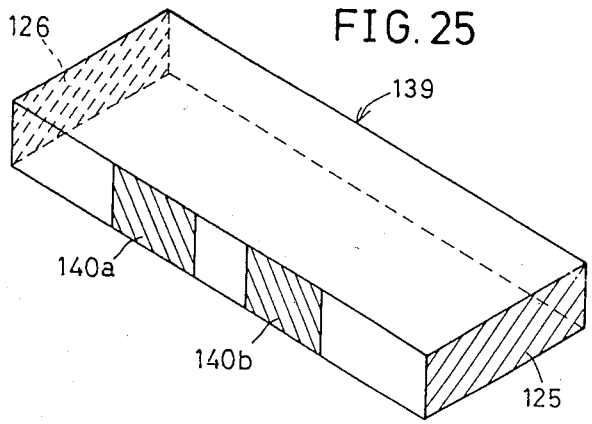

On the surface of the sintered body 139, as shown in FIG. 25, are formed two connecting electrodes 140a and 140b and the external terminal 125 and 126. As is clear from FIGS. 24 and 25, a connection terminal 140a is connected to the lead-out portions 138a and a connection electrode 140b is connected to the lead-out portions 138b. In this manner, the electrode 114b–119b separated by the slits 137, after being polarized, are again electrically reconnected. After the external terminals 125 and 126 are formed, the electrically connected state shown in FIG. 17 is attained.

Figure 26:
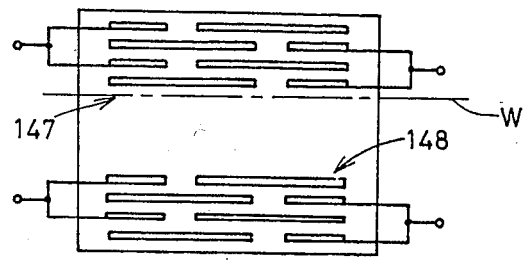
FIG. 26 is a schematic sectional view showing the seventh embodiment of this invention.

FIG. 26 shows a ceramic filter of the seventh embodiment of the invention using electrodes produced in the manner described above. In this case, the two electrode groups, i.e., the electrode groups 147 and 148 are disposed within a ceramic and spaced a predetermined distance apart from each other in the direction of the thickness.

FIGS. 27 through 32 are helpful in describing an eighth embodiment of the invention. In this embodiment, there is provided a ceramic filter utilizing thickness shear vibration, not longitudinal thickness vibration as described before. It is important to note that it has heretofore been very difficult to produce a multilayered type ceramic filter utilizing such thickness shear vibration. The production process for such a filter will be described.

Figure 27:
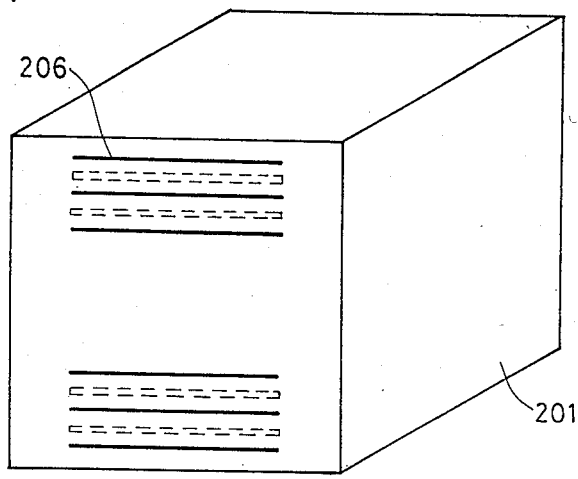
FIG. 27 is a perspective view showing a piezoelectric ceramics used in forming an eighth embodiment of this invention, wherein carbon paste is applied by printing within the ceramics.

First, carbon paste is applied by a printing process to portions of ceramic green sheets at areas where electrodes are to be formed. Then the sheets are laminated. (This carbon paste may contain a ceramic powder, preferably a ceramic powder of the same type as the ceramic green sheets. In such a case, the ceramic powder remains at the sintering stage, so that the cavities are supported by this ceramic powder and thereby prevented from deforming.) This state is shown in FIG. 27. In this figure, layers of carbon are disposed in parallel overlapped relationship to one another within the ceramic 201 in its direction of thickness.

Figure 28:
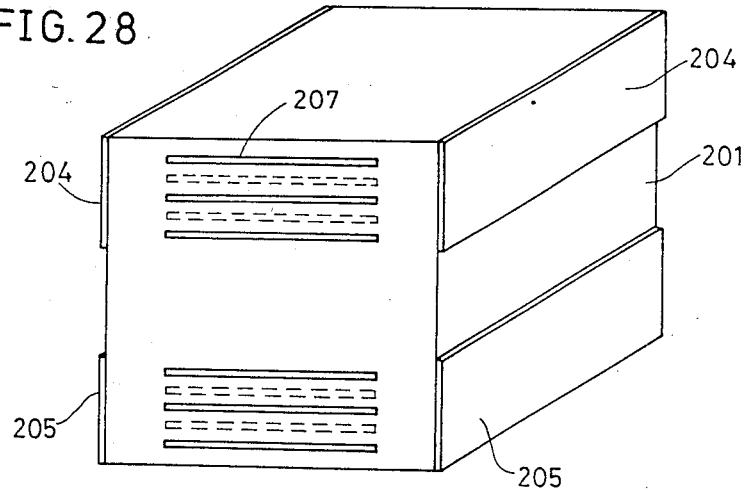
FIG. 28 is a perspective view showing the ceramics of FIG. 27 which is now fired and formed with external electrodes.

The ceramic 201 containing the layers of carbon 206 is then sintered. In this sintering step, the carbon 206 burns out, leaving cavities at positions where the layers of carbons 201 were present. This state is shown in FIG. 28. In FIG. 28 the cavities are referenced by reference numeral 207. In this state, electrodes, of silver for example, are baked on opposite sides of the ceramics 201 to form polarization electrodes 204 and 205, and a polarization treatment is performed so that polarization takes place in a direction which extends at right angles to the direction of the thickness of the ceramics 201. Since there is no internal electrode in the ceramics 201, the ceramic is uniformly polarized. Thereafter, the polarization electrodes 204 and 205 are removed.

While the polarization electrodes 204 and 205 have been shown to be located on the right and left sides of the ceramic 201, they may be positioned on the front and back sides. In such a case, if the polarization electrodes 204 and 205 are porous electrodes covering the openings of the cavities 207, then in the step of filling metal electrodes to be described later with reference to FIG. 29, there is an advantage that the filled molten metal will remain where aplied even during the pulling up of the ceramic 201 from the molten metal. In addition, if such form of polarization electrodes is used, a formation of external electrodes to be later described with reference to FIG. 30 is not necessary.

Figure 29:
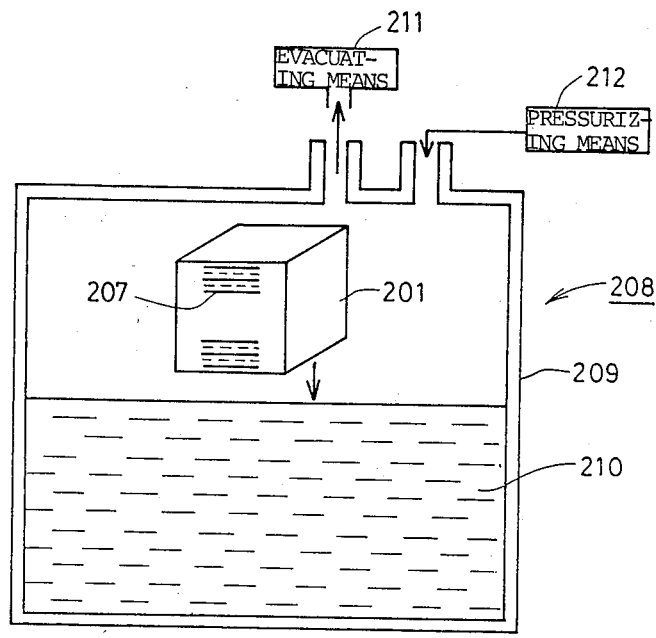
FIG. 29 is a schematic sectional view showing the step of filling an internal electrode metal into cavities formed in the piezoelectric ceramics shown in FIG. 28.

After polarization, the cavities 207 are filled with metal electrodes by means of a molten metal filling device 208 shown in a schematic sectional view in FIG. 29. The filling is performed as follows.

First, an electrode metal 210 in a molten state is stored in a tank 209. Examples of electrode metals 210 are 40/60 solder mixture, metal tin, and metal lead. Next, the pressure in the tank 209 is reduced by evacuating means 211. Under this reduced pressure, the ceramic 201 with its cavities 207 is immersed in the electrode molten metal 210. Subsequently, the evacuating means 211 are disabled, and pressurizing means 212 are activated to pressurize the interior of the tank 209. As a result, the cavities 207 of the ceramics 201 are filled with the internal electrode metal. In addition, to prevent depolarization of the ceramics 201, the filling of the internal electrode metal is effected at temperatures below the curie point. For example, the filling temperature is 170° C. for 40/60 solder, and 200° C. for metal tin. Finally, the ceramics 201 is pulled up out of the molten metal 210, and the electrode metal 210 present in the cavities 207 is allowed to cool and solidify. Thereby a piezoelectric element capable of achieving the objects of this embodiment is obtained.

Figure 30:
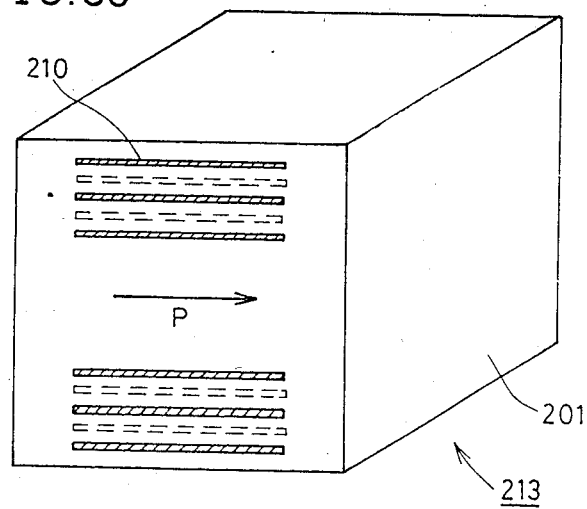
FIG. 30 is a perspective view showing a piezoelectric ceramics formed with internal electrodes obtained through the steps shown in FIGS. 27 through 29.

FIG. 30 is a perspective view of a piezoelectric element 213 obtained by the aforesaid production method. The ceramic 201 has been uniformly polarized in the direction at right angles to the direction of the thickness, with a plurality of electrodes 210 arranged in the direction of the thickness in parallel overlapping relation.

Figure 31:
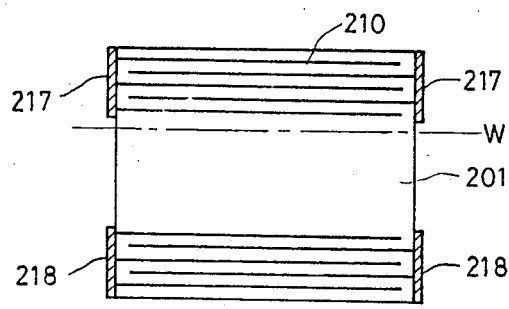
FIG. 31 is a schematic front view showing the eighth embodiment of this invention obtained by providing external electrodes on the piezoelectric ceramics shown in FIG. 30.
Figure 32:
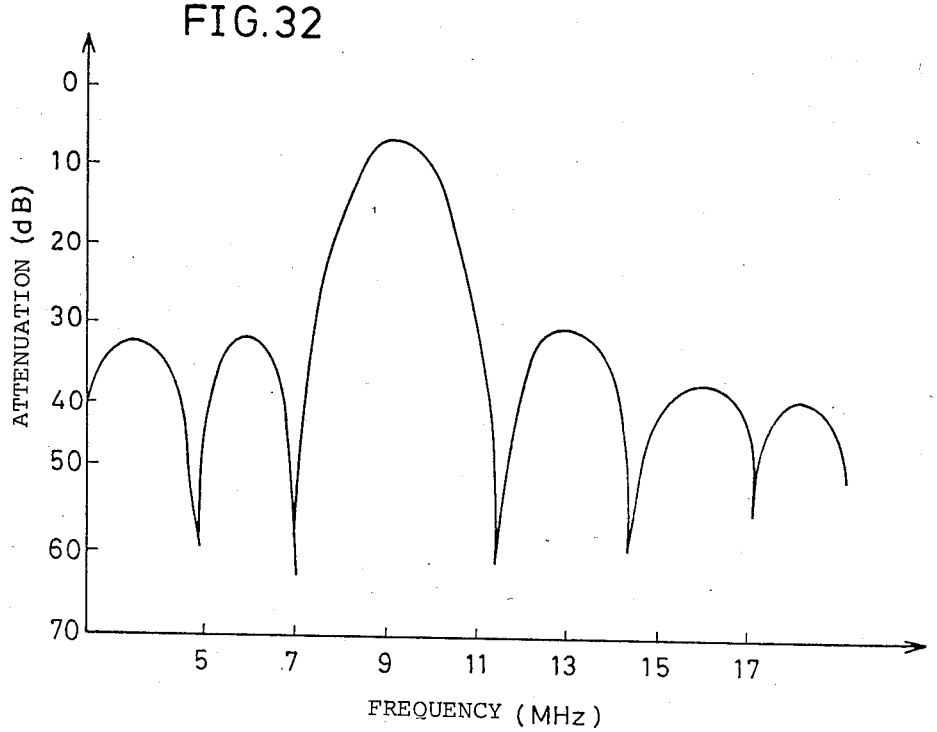
FIG. 32 is a graph showing the frequency characteristic of the embodiment shown in FIG. 31.

Finally, the front and back sides of the piezoelectric element shown in FIG. 30 are formed with external electrodes 217 and 218, whereby the ceramic filter shown in FIG. 31 is obtained. In this case, thermosetting electrically conductive paste which thermally sets at temperatures which do not cause depolarization, e.g., up to 200° C. is used to form the external electrodes 217 and 218. FIG. 32 shows the attenuation-frequency characteristic of the ceramic filter thus obtained. As shown in FIG. 32, the spurious response level is much lower than that of the ceramic filter utilizing the longitudinal thickness vibration described previously.

Though not shown, an advantageous arrangement which can be applied to all the embodiments described above will now be described. In this invention, as described above, bulk waves are transmitted within the piezoelectric ceramic in the direction of the thickness of the piezoelectric ceramic. On the other hand, in such piezoelectric devices as piezoelectric resonators and piezoelectric filters, it is required to adjust the center frequency or resonant frequency according to specific applications. Thus, in this invention, since bulk waves propagate in the direction of the thickness of the piezoelectric ceramic and because the internal electrodes are disposed to overlap one another in the direction of the thickness of the piezoelectric ceramics, a desired center frequency for a filter can be obtained by adjusting the thickness of the ceramic layer between the internal electrode positioned on the outermost side and the end surface of the piezoelectric ceramics close to the internal electrode. For example, in the first embodiment shown in FIG. 5, a desired center frequency can be obtained by controlling the thickness between the internal electrode 14a and the end surface of the piezoelectric ceramic 11 adjacent thereto in the direction of the thickness thereof and/or the thickness of the ceramics between the internal electrode 15e and the end surface of the piezoelectric ceramics 11 adjacent to the internal electrode 15a in the direction of the thickness of the piezoelectric ceramics 11. Preferably, a voltage is applied across the external electrodes 21 and 22 in the embodiment shown in FIG. 5 to derive an output from the external electrodes 23 and 24, i.e., to activate the ceramic filter. Under this condition the end surfaces of the piezoelectric ceramic 11 in the direction of the thickness are processed or coated with a damping agent to increase its mass, whereby the central frequency can be easily and reliably adjusted by actual measurement on real time. Thus, a ceramic filter in which the thickness between the internal electrodes which is positioned on the outermost side and the end surface of the piezoelectric ceramics in the direction of the thickness, is also made possible by the present invention.

Figure 33:
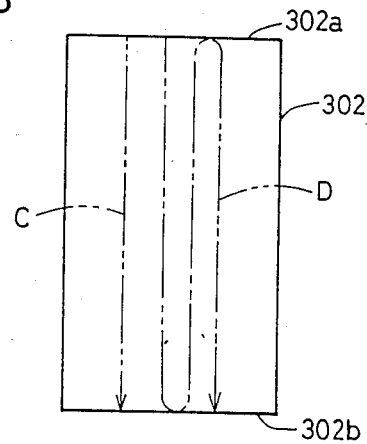
FIG. 33 is a schematic front view for explaining the effects of triple transient echo.

FIG. 33 is a schematic front view useful for explaining the effects of reflected waves namely triple transit echo waves (T.T.E.). In a ceramic filter of the present invention according to an embodiment where bulk waves propagate within the piezoelectric ceramics 302 in the direction of the thickness and where the filter is formed by stacking a number of ceramic green sheets and electrode patterns and sintering the laminate, a very small-sized bulk wave device can be constructed another advantage offered by the ceramic of the invention is that it is possible to obtain bulk wave devices having various impedances by merely changing the internal electrode forming method and the polarization method.

However, because of the large difference in density between the ceramics 302 and air, a bulk wave C propagate as shown in a schematic front view in FIG. 33. It is seen that the wave is easily reflected back and forth from the end surfaces 302a and 302b of the ceramic 302 along the thickness of the ceramic. Thus, a reflected wave D called triple transit echo (T.T.E) is generated.

Accordingly, in the ceramic filter of the first embodiment shown in FIG. 5, for example, the ceramic layers positioned outwardly of the internal electrodes 14a and 14e do not positively vibrate. Therefore, even if the waves are reflected from the end surfaces 302a and 302b of FIG. 33, the vibration mode of the reflected waves differs from that of the bulk wave C; therefore, it is possible that propagation of reflected bulk waves other than the bulk waves of the intended frequency interferes with the frequency characteristic such that the desired performance is not obtained.

Figure 34:
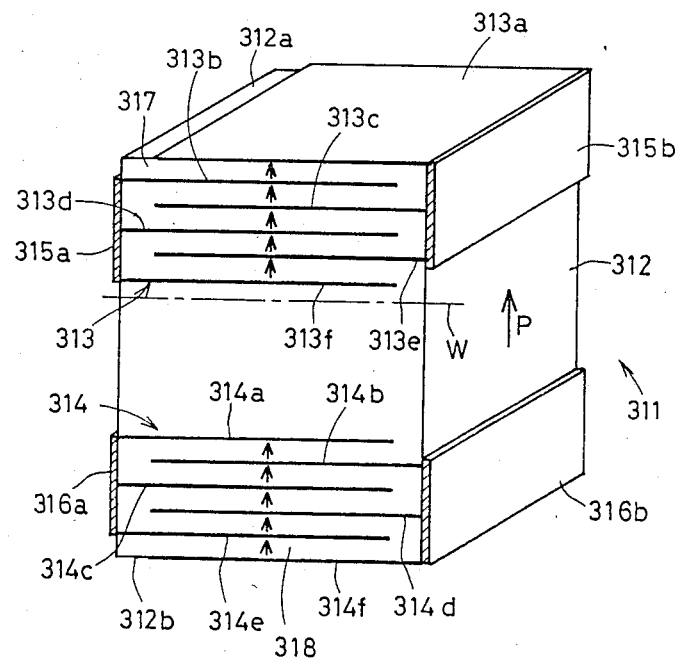
FIG. 34 is a perspective view showing a ninth embodiment of this invention designed to eliminate the effects of triple transient echo shown in FIG. 33.

FIG. 34 is a perspective view of a ninth embodiment of the invention which addresses and solves the problem noted above. A filter 311 includes a ceramic 312 treated for polarization in the direction of the thickness, and internal electrodes 313 and 314 consisting of a plurality of electrodes 313a . . . 313f and 314a . . . 314f disposed within the ceramics 312 in parallel overlapping relation in the direction of the thickness. The electrodes 313a . . . 313f and 314a . . . 314f forming the internal electrodes 313 and 314 are alternately led out to opposite lateral surfaces of the ceramics 312 and connected to external electrodes 315a, 315b and 316a, and 316b. This embodiment is characterized in that the electrodes 313a and 314f positioned on the outermost sides in the internal electrodes 313 and 314 are respectively formed on the end surfaces 312a and 312b of the ceramic 312 in the direction of the thickness.

Thus, if the internal electrode 313 is used as the input electrode and a voltage is applied across the external electrodes 315a and 315b, bulk waves propagates in the direction of the thickness of the ceramic 312 and transmitted on the other internal electrode 314, and an output is develops at the external electrodes 316a and 316b. In this case, the outermost ceramic layers 317 and 318 are also positively vibrated, so that bulk waves propagating in the direction of the thickness of the ceramics 312 are trapped between the electrodes 313a and 313f. Thus, even if bulk waves propagating within the ceramic 312 in the direction of the thickness are reflected from the electrodes 313a and 314f owing to the difference in density between the electrodes 313a and 314f and air outside the ceramic 312, the reflected bulk waves resulting from the reflection will have the same vibration mode as the bulk waves propagating from the internal electrode 313 to the internal electrode 314. Therefore, only the bulk waves of the intended frequency will propagate within the ceramic 312 in the direction of the thickness. The amplitude characteristics will be greatly improved, no T.T.E. will occur, and the insertion loss will be low in accordance with design goals.

In addition, it should be noted that the present form of the internal electrodes on the outermost end surfaces of the piezoelectric ceramics in the direction of the thickness can be used in all the other embodiments described so far.

Figure 35:
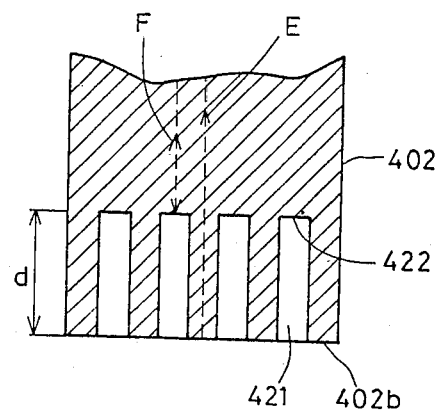
FIGS. 35 and 36 are a fragmentary sectional view and a bottom view, respectively, for explaining the tenth embodiment of this invention.
Figure 36:
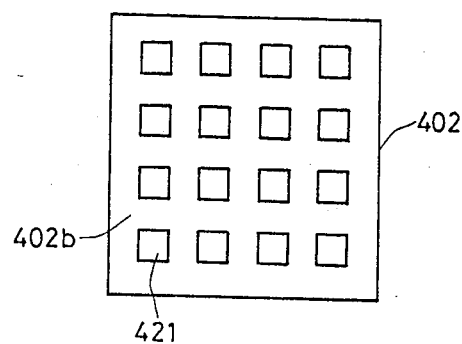

FIGS. 35 and 36 are a fragmentary sectional view and a bottom view which show a tenth embodiment of the invention. This embodiment is also arranged to control the thickness of the ceramic layers positioned outwardly of the outermost electrodes in the direction of the thickness of the ceramic described previously and, as in the ninth embodiment, to eliminate bulk waves which cause the spurious effects. As seen in FIG. 35 (the internal electrodes are omitted from the illustration) and FIG. 36, a plurality of grooves 421, useful for eliminating unnecessary bulk waves, are formed at one end surface 402b of a piezoelectric ceramic in the direction of the thickness.

The bottoms 422 of the grooves 421 are parallel to the end surface 402b, as shown and the depth d of the grooves 421 is such that when the wave length of bulk waves is denoted by λ, the relation $$2d = (n + \tfrac{1}{2})\lambda$$

(where n=0, 1, 2 ...) is satisfied. Thus, bulk waves E reflected from the end surface 402b are one half wavelength out of phase with bulk waves F reflected from the bottoms 422 of the grooves 421, so that the reflected waves E and F cancel each other. Thus, the reflected bulk waves are effectively eliminated.

In the embodiment shown in FIGS. 35 and 36, the grooves 421 have been formed as illustrated. Preferably, however, the total area of the bottoms 422 of the grooves 421 is made equal to the remainder of the area of the end surface 402b, so that the bulk waves reflected from the end surface 402b and the bottoms 422 of the grooves 421, respectively, are equalized and hence eliminated.

However, since it is only through those ceramic portions where the internal electrodes overlap each other that bulk waves propagate in the direction of the thickness, the grooves 421 may be formed in the region of the ceramic corresponding to the overlapping portions of the internal electrodes. It is to be pointed out that the shape of the grooves 421 and the manner in which they are distributed are not limited as shown and may assume other shapes.

Figure 37:
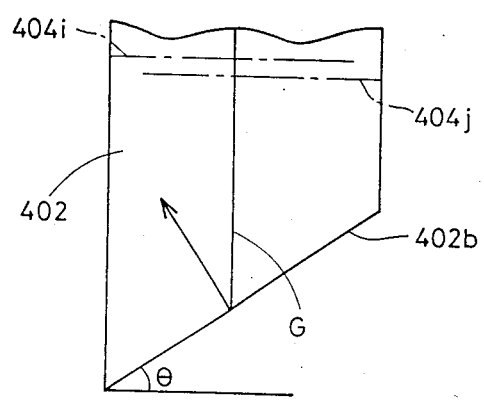
FIG. 37 is a fragmentary front view for explaining an eleventh embodiment of this invention.

FIG. 37 is a schematic front view for explaining an eleventh embodiment of this invention. As is clear from FIG. 37, shows that for bulk wave elimination, one end surface 402b of a ceramics 402 in the direction of the thickness is shaped as a non-parallel plane with respect to the internal electrodes 404i and 404j (shown in phantom lines). Thus, a bulk wave G is reflected by the end surface 402b as shown, which means that it is reflected in a direction where the internal electrodes 404i and 404j are not present. Thus, it is seen that spurious vibration due to reflected bulk waves can be effectively reduced.

Figure 38:
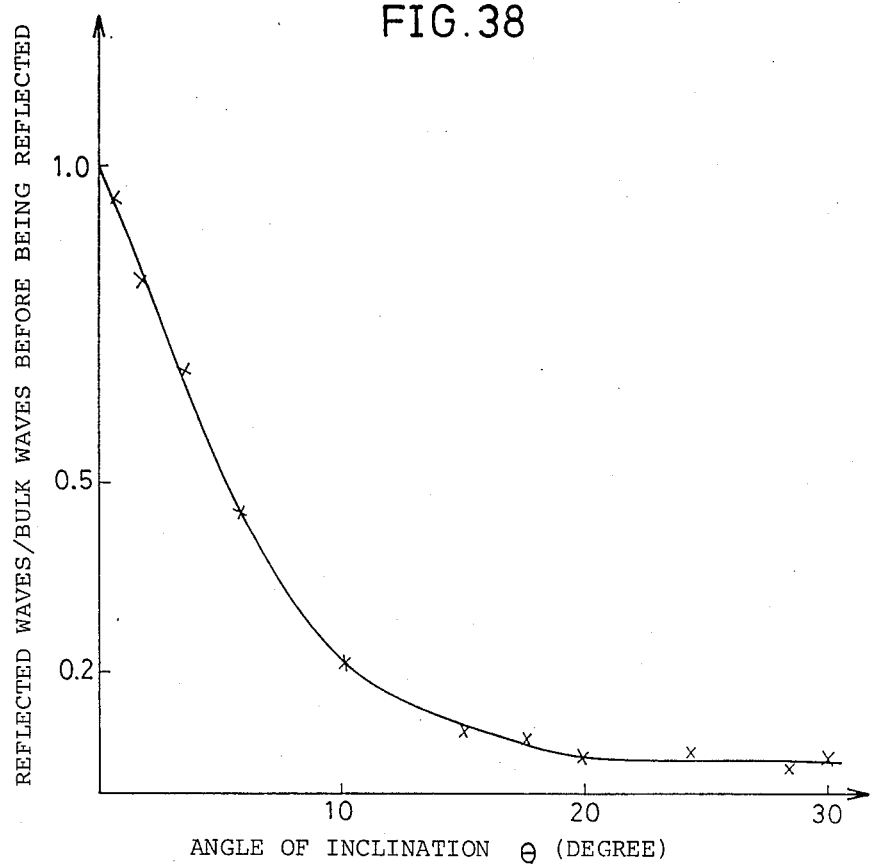
FIG. 38 is a graph showing the relation between the angle of inclination $\theta$ and reflection coefficient in the embodiment shown in FIG. 37.

In addition, between the angle of inclination θ of the end surface 402b in the embodiment shown in FIG. 37 and the reflectance, there is a relation shown in the graph of FIG. 38. Therefore, it is seen that if θ ≧ 10°, then the reflectance is 80% smaller than when θ=0°. Thus, it is preferable that the angle of inclination θ be at least 10°.

Figure 39:
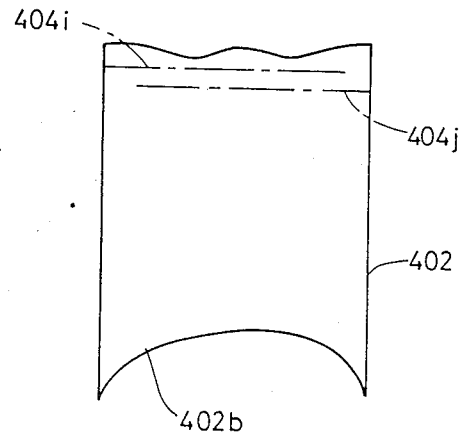
FIG. 39 is a schematic front view showing a modification of the embodiment shown in FIG. 37.

In addition, in the eleventh embodiment, not only can the end surface 402b be inclined as shown in FIG. 37, but it can also be shaped in various manners so long as the bulk waves are reflected in a direction away from the internal electrodes. For example, as shown in FIG. 39, the end surface 402b is curved like the lateral surface of a cylinder or as a spherical surface.

FIG. 40 illustrates another embodiment of the invention. In the embodiment of FIG. 40, one end surface 402b of a ceramic 402 in the direction of the thickness is randomly formed with recesses 431 in order to eliminate bulk waves. The average depth x of the recesses 431 is selected so that x ≧ λ/2 where λ is the wavelength of bulk waves. The formation of the grooves 431 ensures that bulk waves traveling straight to the end surface 402b are scattered. Thus, bulk waves reflected in the direction of the internal electrodes can be effectively eliminated.

In addition, the grooves 431 may be formed after sintering or they may be formed simultaneously with the stacking and pressing of ceramic green sheets before sintering.

FIG. 41 illustrates a thirteenth embodiment of the invention. In the embodiment of FIG. 41, a sound absorbing layer 441 having substantially the same acoustic impedance as a ceramic 402 is attached to one end surface 402b of the ceramics 402 in the direction of the thickness. The layer 441 eliminates bulk-waves. If the ceramic 402 is of the PZT ceramics with a specific gravity of about 8, the sound absorbing layer 441 will be formed of a sound absorbing material mixed with PZT powder or lead or other metal powder having relatively high specific gravity or an oxide such as PbO or $Nb_2O_5$, whereby substantially the same magnitude of acoustic impedance as that of the ceramic 402 can be obtained.

In the present embodiment, since the sound absorbing layer 441 having substantially the same magnitude of acoustic impedance as that of the ceramic is attached to one end surface 402b of the ceramic 402 in the direction of the thickness, bulk waves propagating toward one end surface 402b in the direction of the thickness can be effectively absorbed by the sound absorbing layer 441. Therefore, the production of undesirable bulk waves is prevented.

In addition, the sound absorbing layer 441 is not necessarily attached to the entire area of the end surface 402 in the direction of the thickness and instead it may be attached only to the portion where bulk waves are expected.

The four types of bulk wave eliminating means of the tenth, eleventh, twelfth and thirteenth embodiments can be suitably combined to further improve elimination. To show this, test results from a test performed on a combination of bulk wave eliminating means used in the embodiments shown in FIGS. 40 and 41 will be provided below.

A ceramic filter was fabricated using a lead titanate ceramic 402 and a plurality of internal electrodes 1 mm in diameter, the electrodes were arranged within the. The interelectrode distance was fixed at 100 μm, the propagation distance was 200 μm, and the number of pairs of electrodes was 4.5. One end surface 402b of the ceramics 402 in the direction of the thickness was randomly formed with recesses whose average depth x was greater than $\lambda/2$, while a sound absorbing layer 441 was attached to the ceramic. It was found that whereas the ceramic filter before being treated produced a great amount of spurious vibrations, the ceramic filter according to the invention provided a characteristic curve which was substantially improved in accordance with the design goals.

It is to be pointed out that since the embodiments shown in FIGS. 10 through 13 have their end surfaces treated in the direction of thickness, they can be used in the first through eighth embodiments.

In the ceramic filter of the invention, bulk waves propagate from the input electrodes group to the output electrodes group and vice versa and hence an electrical-mechanical conversion loss of 3 dB for each of the input and output electrode groups cannot be avoided. Thus, a total electrical-mechanical conversions loss of 6 dB due to bidirectionally is present. In a fourteenth embodiment shown in FIG. 42 and in a fifteenth embodiment shown in FIGS. 43 and 44 bidirectional propagation loss is eliminated.

FIG. 42 illustrates a fourteenth embodiment of the invention. In FIG. 42, only the input electrode group side, i.e., the excitation side of a bulk wave filter serving as a bulk wave device is shown. The excitation section comprises first and second excitation parts 517a and 517b. The first and second excitation parts 517a and 517b comprise a plurality of internal electrodes 513a . . . 513d and 513e . . . 513i, respectively. Then are spaced $\frac{1}{4}\lambda$ apart in the direction of the thickness of a piezoelectric ceramic 512. The internal electrodes 513a . . . 513i of the first and second excitation parts 517a and 517b are respectively connected to external electrodes 515a, 515b, and 515c formed on opposite sides of the piezoelectric ceramic 512. As shown, in the second excitation part 517b, a coil 519 is connected between the external electrodes 515a and 515c. The second excitation part 517b is adapted to reflect bulk waves which propagate from the first excitation part 517a. The coil 519 serves to increase the efficiency of reflecting bulk waves coming from the first excitation part 517a and is not absolutely necessary. It does, however, from part of the bulk wave direction control means of the present invention.

In the embodiment shown in FIG. 42, when a voltage is applied across the external electrodes 515a and 515b as to activate the first excitation part 517a, bulk waves propagate on both sides of the first excitation part 517a, i.e., in opposite directions along the thickness of the piezoelectric ceramic 512. However, since the first and second excitation parts 517a and 517b are spaced $\frac{1}{4}\lambda$ apart, bulk waves generated by the first excitation part 517a are transmitted to the second excitation part 517b with a delay of $\frac{1}{4}\lambda$. Further, the transmitted bulk waves are reflected by the second excitation part 517b and are further delayed by $\frac{1}{4}\lambda$ passing through 517b and also delayed by $\frac{1}{4}\lambda$ upon returning from the second excitation part 517b to the first excitation part 517a. Thus, the bulk waves propagated from the first excitation part 517a to the second excitation part 517b return to the first excitation part 517a with a delay of $\lambda$. Thus means that they are propagated in phase with bulk waves which are propagated in the upper portion of FIG. 42, i.e., on the side opposite to the second excitation part 517b. Therefore, the embodiment of FIG. 42, produces a unidirectional excitation part.

In addition, though not shown, an output electrode group is constructed as in the case of the bulk wave filters described so far.

Also, in the embodiment of FIG. 42, the first and second excitation parts 517a and 517b have been located at a distance of $\frac{1}{4}\lambda$ from each other. However, it should be noted that they may be spaced $n\lambda + \frac{1}{4}\lambda$ (where n is an integer) apart from each other.

Figure 43:
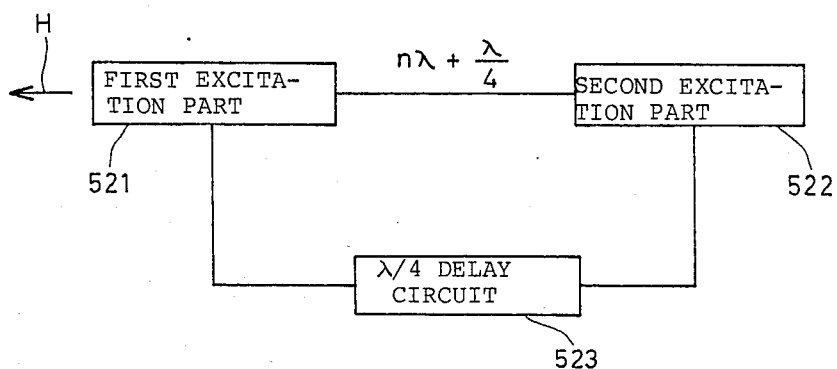
FIG. 43 is a circuit block diagram explaining a fifteenth embodiment of this invention.
Figure 44:
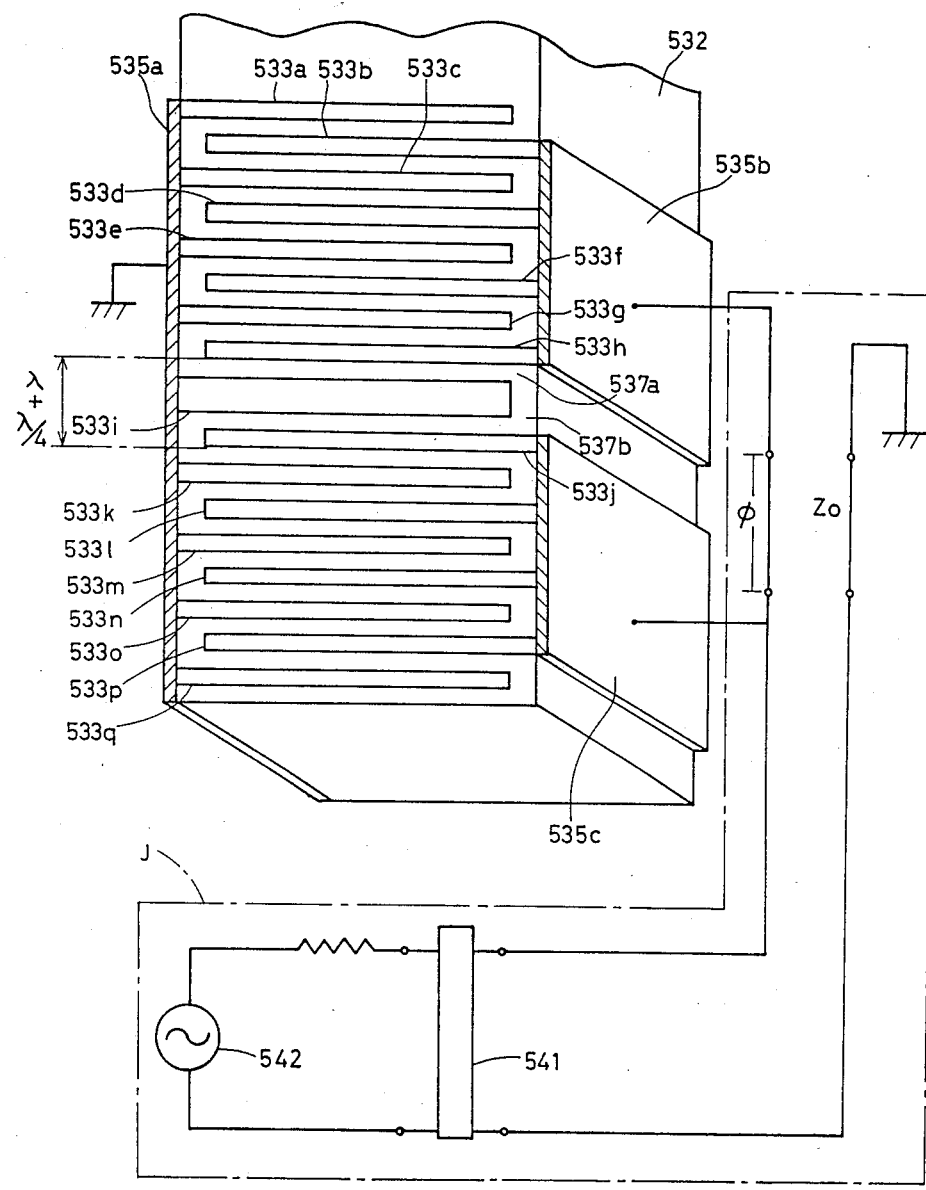
FIG. 44 is a fragmentary perspective view showing the concrete arrangement of the fifteenth embodiment of this invention.

FIG. 43 is a schematic circuit block diagram which explains a fifteenth embodiment of the invention. In this embodiment, bulk waves are not reflected as they are in the case of the embodiment shown in FIG. 42; they are instead delayed by $\lambda/4$. Thus, a unidirectional bulk wave device is formed. That is, two excitation parts 521 and 522 are arranged $n\lambda + \lambda/4$ apart from each other. This arrangement is the same as that shown in FIG. 42. Further, in this embodiment, a $\lambda/4$ delay circuit 523 is connected between the two excitation parts 521 and 522. For the $\lambda/4$ delay circuit 523, any desired arrangements may be used, but one comprising capacitors and resistors is preferable. This is because the $\lambda/4$ delay circuit can be constructed integrally with the piezoelectric ceramic base. In the embodiment shown in FIG. 43, since the first and second excitation parts 521 and 522 are spaced at a distance of $n\lambda + \lambda/4$ and since the $\lambda/4$ delay circuit 523 is connected between the first and second excitation parts 521 and 522, the phase of bulk waves generated by the first excitation part 521 lags by $\lambda/4$ behind bulk waves generated by the second excitation part 522, whereby the bulk waves generated by the second excitation part 522 are transmitted to the first excitation part 521 with a delay of $\lambda/4$. Thus, they are transmitted in phase with the bulk waves propagating at the first excitation part 521 in the direction H in FIG. 43, their direction of propagation being also the same, or H. On the other hand, some of the bulk waves generated by the first excitation part 521 which propagate toward the second excitation part 522 arrive with a delay of $\lambda/4$ but are canceled because they are in reverse phase with the bulk waves generated by the second excitation part 522. Thus, in the embodiment shown in FIG. 43, bulk waves are propagated only in the direction of arrow H.

an example of a reduction to practice of the embodiment described above with reference to FIG. 43 will now be described with reference to the perspective view of FIG. 44. In this example, a first excitation part 537a and a second excitation part 537b are spaced $\lambda + \lambda/4$ apart from each other in the direction of the thickness of a piezoelectric ceramic 532. The excitation parts 537a and 537b include a plurality of internal electrodes 533a . . . 533h and 533i . . . 533q, respectively. The internal electrodes 533a . . . 533q are respectively connected to external electrodes 535a, 535b, and 535c and are led out to opposite sides. A delay circuit J is connected between the external electrodes 535b and 535c so that the first excitation part 535a may generate bulk waves lagging by a phase difference of $\lambda/4$ behind bulk waves generated by the second excitation part 537b. In addition, FIG. 44, the numeral 541 denotes a matching network, and 542 is a power source. In the bulk device shown in FIG. 44, since the first and second vibrating parts 537a and 537b are spaced $\lambda + \frac{1}{4}\lambda$ apart from each other and since the first excitation part 537a is adapted to produce bulk waves lagging by a phase difference of $\lambda/4$, as described above, the bulk waves produced are propagated only upwardly in the direction of the thickness of the piezoelectric ceramics 532, i.e., to the opposite side from the first excitation part 537a to the second excitation part 537b.

In addition, in the embodiment shown in FIG. 42, the first and second excitation parts have been shown spaced $\lambda/4$ apart from each other, but in the case where 3-phase unidirectional transducer having a phase delay of 120°-120°-120°, it is also possible to propagate bulk waves only in one direction.

It is to be pointed out that since the fourteenth and fifteenth embodiments described above relate to the arrangement and construction of input electrode groups, i.e., construction of excitation parts, they are also applicable to all other embodiments described so far.

FIGS. 45 through 52 show embodiments in which internal electrodes are weighted to obtain a desired pass band characteristic. These embodiments are characterized in that the internal electrodes are weighted in a multi-layered type filter such as the one shown in FIG. 5. Since the rest of the arrangement is the same as in the multi-layered type ceramic filter described above, only the weighting structure of the internal electrodes will be explained.

Figure 45:
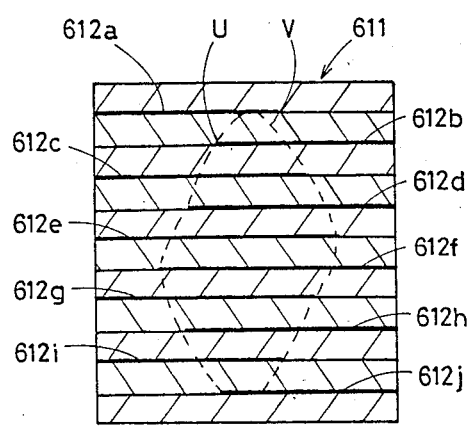
FIG. 45 is a schematic sectional view showing an example of weighting in a sixteenth embodiment of this invention.

FIG. 45 is a sectional view for explaining the structure for weighting interdigital electrodes in the pertinent embodiments of the invention. FIG. 45 shows the formation of interdigital electrodes 612a . . . 612j disposed in the direction of the thickness in overlapping relation within a ceramic 11. The interdigital electrodes 612a . . . 612j, as seen in FIG. 45, are formed so that their transverse lengths as viewed in the figure overlap each other. Therefore, as is clear from the respective shapes of envelope lines U and V, it is seen that this construction is weighted.

Figure 46:
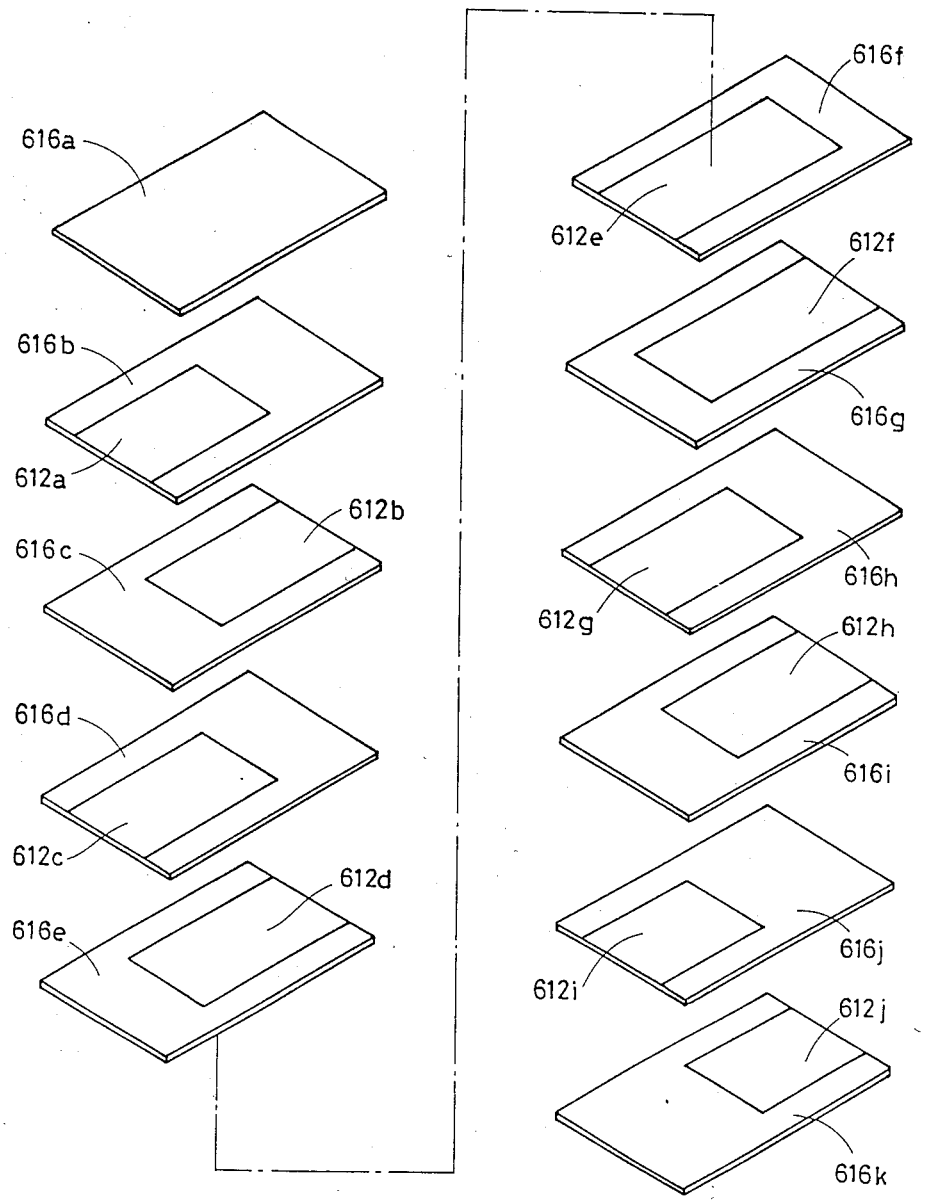
FIG. 46 is a perspective view for explaining the process of producing the structure shown in FIG. 45.

The particular configuration shown in FIG. 45 can be obtained, as shown in a perspective view in FIG. 46 by stacking ceramic green sheets 616a . . . 616k formed with electrode patterns serving as the interdigital electrodes 612a . . . 612j, and sintering the same.

Though not shown in FIG. 45, it is possible to form external electrodes on the right and left end surfaces of the ceramic 611, to extend the ceramics 611 in the direction of the thickness or in the transverse direction, and to form another interdigital electrode group. The latter interdigital electrode group can be formed with a pair of external electrodes, to thereby provide any of the filters described so far. The filter construction weighted in the manner shown in FIG. 45 provides a filter having a negligible side lobe response and almost no ripple, i.e., having a greatly improved selectivity characteristics.

Figure 47:
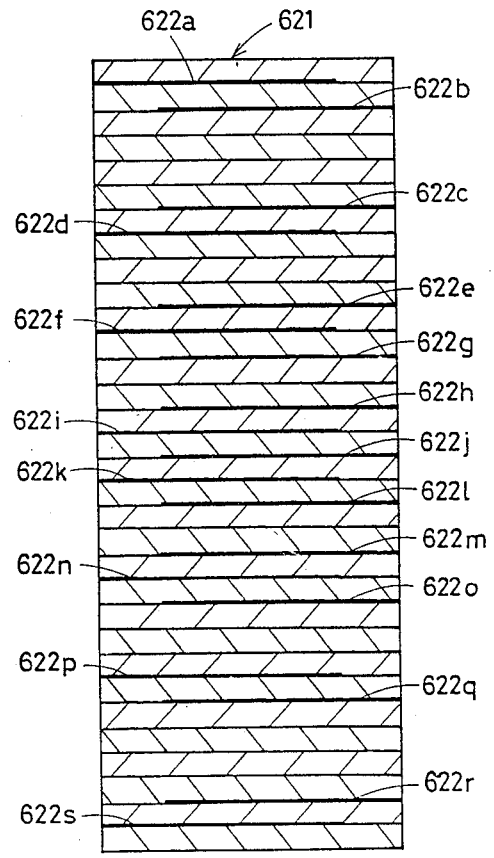
FIG. 47 is a sectional view showing a second example of weighting.

FIG. 47 is a sectional view showing another example of electrode weighting in a manner which corresponds to the arrangement of FIG. 45. In this case too, interdigital electrodes 622a . . . 622s are disposed to overlap each other in the direction of the thickness of a ceramic 621, but weighting is applied so that the interdigital electrodes 622a . . . 622s are distributed unevenly in the direction of the thickness. Also in the case where the weighting shown in FIG. 45 is used, since the interdigital electrodes are weighted, it is possible to form a filter having a good selectivity characteristic.

Figure 48:
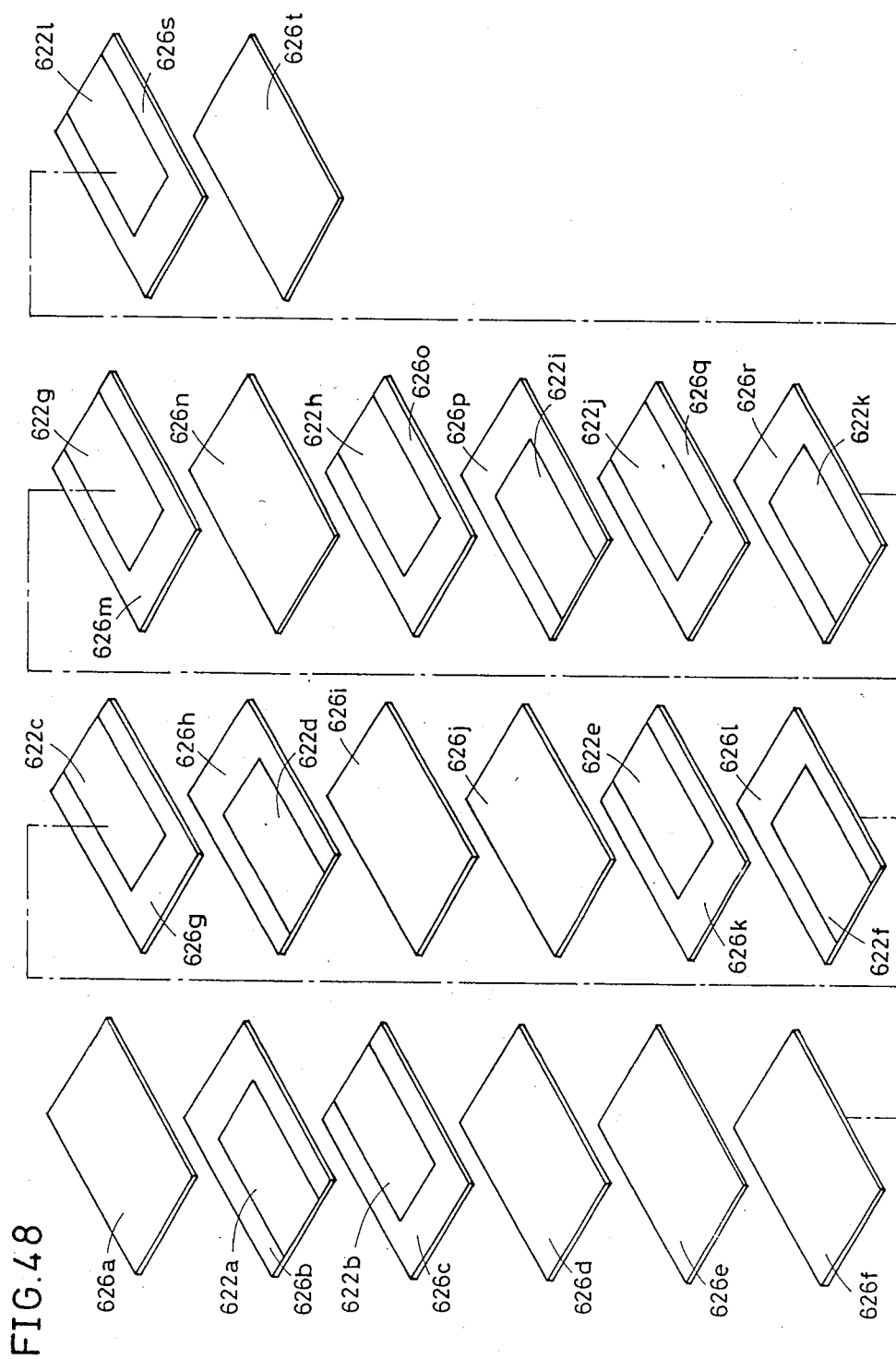
FIG. 48 is a perspective view for explaining the process of producing the structure shown in FIG. 47.

The weighting shown in FIG. 47 is obtained, as shown in a perspective view in FIG. 48, by stacking a ceramic green sheet 626a, ceramic green sheets 626b and 626c having interdigital electrodes 622a and 622b formed thereon, ceramic green sheets 626d, 626e, and 626f having no electrode formed thereon, ceramic green sheets 626g and 626f having interdigital electrodes 622c and 622d formed thereon, an so on until on end ceramic green sheet 626t is reached, in accordance with the above order. The ceramic green sheets 626a . . . 626m are stacked in the reverse order on the ceramic green sheet 626t, and are sintered. In this case also, the ceramic 621 of the construction shown in FIG. 47 is extended in the direction of the thickness, another electrode group is formed, and external electrodes are formed, whereby a multi-layered type ceramic filter is produced.

Figure 49:
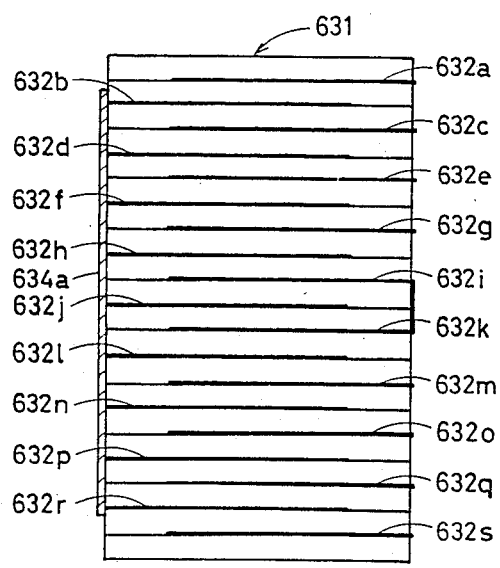
FIGS. 49 and 50 are a front view and a right-hand side view, respectively, for explaining a third example of weighting.
Figure 50:
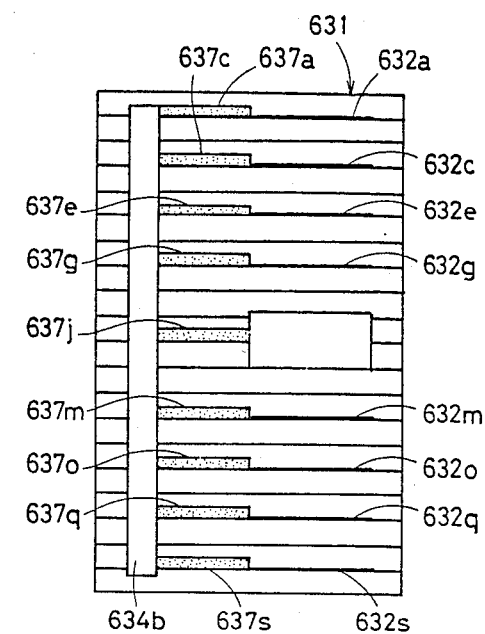
Figure 51:
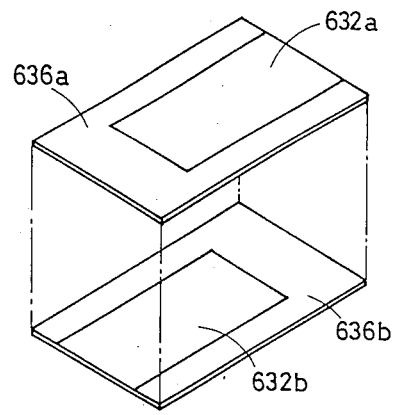
FIG. 51 is a schematic perspective view for explaining how ceramic sheets in the structure shown in FIGS. 49 and 50 are stacked.

FIGS. 49 and 50 show a front sectional view and a right-hand side view, respectively, of a third example of weighted electrode arrangement according to the invention. Interdigital electrodes 632a . . . 632s overlap each other in the direction of the thickness of a ceramic 631 and alternately emerge at opposite sides as shown in FIG. 51, for example. The structure being obtained by stacking ceramic green sheets 636a and 636b having the electrodes 632a and 632b of the same shape formed thereon. In this case, weighting is attained not by the shape of the interdigital electrodes but by controlling voltages impressed between the individual interdigital electrodes 632a . . . 632s.

As shown in FIg. 50, the interdigital electrodes 632a, 632c . . . 632s which emerge to the right have resistors 637a, 637c . . . 637s respectively connected thereto, and one external electrode 634b is connected through said resistors 637a, 637c . . . 637s. Thus, by setting the resistors 637a, 637c . . . 637s at different resistance values, it is possible to control voltages impressed between individual interdigital electrodes 632a . . . 632s. Therefore, where weighting is used to construct the filter, the selectivity characteristic can be greatly improved.

Furthermore, the interdigital electrodes 632b, 632d . . . 632r are connected to the external electrode 634a on the left-hand side surface as viewed in the figure. In FIG. 50, the electrodes 632i and 632k are a common electrode connected to the external electrode 634b through a resistance wire 637j.

Figure 52:
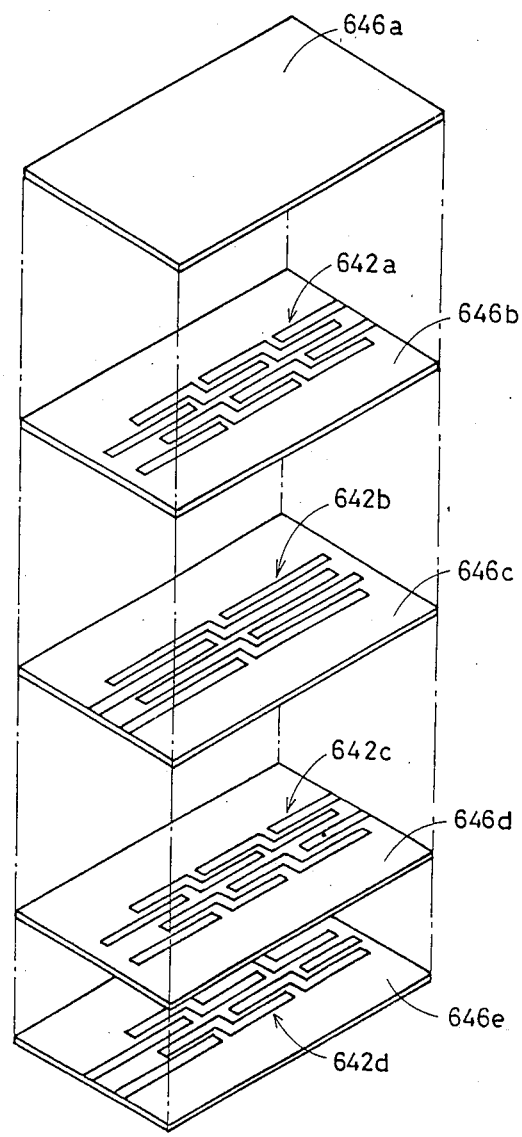
FIG. 52 is a schematic perspective view for explaining a fourth example of weighting.

FIG. 52 illustrates a fourth example of a weighted electrode arrangement according to the invention. In the example shown in FIG. 52, a ceramic green sheet 646a having no electrode formed thereon, and ceramic green sheets 646b, 646c, 646d, and 646e having interdigital electrodes 642a, 642b, 642c and 642d in divisional electrode patterns thereon, are successively stacked. Voltages are impressed between the individual electrodes in a changing fashion, whereby weighting is obtained. FIG. 52 schematically illustrates only some ceramic green sheets in order to show the divided shape of the electrode patterns, but actually, a desired number of ceramic green sheets having variously divided electrodes formed thereon are stacked, and another electrodes group is formed, whereby a ceramic filter is produced.

It is to be noted that the weighting methods described with reference to FIGS. 45 through 52 are also applicable to the first through fifteenth embodiments described previously.

The above description refers to ceramic filters. However, when the ceramic filters of the fourth through sixteenth embodiments are used as resonators by using only one of the input and output electrodes groups, advantages not found in the prior art are realized. In the case where a resonator is constructed, the portion above or below the dash-dot line W shown in FIGS. 10, 13, 16, 26, 31, and 34 is used whereby a resonator of novel construction is obtained.

Although the present invention has been described in connection with preferred embodiments thereof, other modifications and variations will now become apparent to persons skilled in the art. It is preferred, therefore, that the invention be limited not by the specific embodiments disclosed herein but only by the following claims.

What is claimed is:

1. A ceramic filter comprising:

a multi-layered piezoelectric ceramic body including a plurality of stacked ceramic sheets, said ceramic body having a thickness extending through said plurality of stacked sheets and first and second opposite ends separated along said thickness, said ceramic being polarized in one direction along a direction corresponding to said thickness;

bulk wave eliminating means for eliminating bulk waves which produce spurious vibrations other than utilizable bulk waves located at, at least one of said first and second ends of said ceramic;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart, alternate internal electrodes which follow one another in each said input and output electrode groups being led out to respective first and second lateral sides of said piezoelectric ceramic;

a first pair of external electrodes having first and second external contacts for contacting, respectively, said input internal electrodes which are led out at said first and second lateral sides, and a second pair of external electrodes having first and second external contacts for contacting, respectively, said output internal electrodes which are led out at said first and second sides; and means for applying a voltage to at least one of said input electrodes and producing an output at said output electrode group in response to vibrations which propagate from said input group to said output group.

2. A ceramic filter comprising:

a multi-layered piezoelectric ceramic body including a plurality of stacked ceramic sheets, said ceramic body having a thickness extending through said plurality of stacked sheets and first and second opposite ends separated along said thickness; said multi-layered piezoelectric ceramic being polarized in one direction along a direction corresponding to said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart, alternate internal electrodes which follow one another in each said input and output electrode groups being led out to respective first and second lateral sides of said piezoelectric ceramic;

at least one of said input and output electrode groups comprising first and second excitation parts spaced $n\lambda + \lambda/4$ apart in the direction of said thickness of said multi-layered piezoelectric ceramic;

bulk wave direction control means for enabling bulk waves produced by said first excitation part to propagate in a direction opposite to said second excitation part;

a first pair of external electrodes having a first and second external contacts for contacting, respectively, said input internal electrodes which are led out at said first and second lateral sides, and a second pair of external electrodes having first and second external contacts for contacting, respectively, said output internal electrodes which are led out at said first and second sides; and means for applying a voltage to at least one of said input electrodes and producing an output at said output electrode group in response to vibrations which propagate from said input group to said output group.

3. A ceramic filter comprising:

a multi-layered piezoelectric ceramic body including a plurality of stacked ceramic sheets, said ceramic body having a thickness extending through said plurality of stacked sheets and first and second opposite ends separated along said thickness; said multi-layered piezoelectric ceramic being polarized in one direction along a direction corresponding to said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart, alternate internal electrodes which follow one another in each said input and output electrode groups being led out to respective first and second lateral sides of said piezoelectric ceramic, at least one of said input and output electrode groups being weighted;

a first pair of external electrodes having a first and second external contacts for contacting, respectively, said input internal electrodes which are led out at said first and second lateral sides, and a second pair of external electrodes having first and second external contacts for contacting, respectively, said output internal electrodes which are led out at said first and second sides; and means for applying a voltage to at least one of said input electrodes and producing at said output electrode group in response to vibrations which propagate from said input group to said output group.

4. A ceramic filter comprising:

a multi-layered piezoelectric ceramic body including a plurality of stacked ceramic sheets, said ceramic body having a thickness extending through said plurality of stacked sheets and first and second opposite ends separated along said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

alternate ones of said plurality of ceramic sheets on which said internal electrodes are formed being oppositely polarized along the direction of said thickness, alternate internal electrodes which follow one another in each said input and output electrode groups being led out respectively to respective first and second lateral sides of said ceramic body;

a first pair of external electrodes having first and second external contacts for contacting, respectively, said input internal electrodes which are led out at said first and second sides and a second pair of external electrodes having first and second external contacts for contacting, respectively, said output internal electrodes which are led out at said first and second sides;

bulk wave eliminating means for eliminating bulk waves which produce spurious vibrations other than utilizable bulk waves located at, at least one of said first and second ends of said ceramic; and means for applying a voltage to at least one of said input electrodes and producing an output at said output electrode group in response to vibrations which propagate from said input group to said output group.

5. A ceramic filter comprising:

a multi-layered piezoelectric ceramic body including a plurality of stacked ceramic sheets, said ceramic body having a thickness extending through said plurality of stacked sheets and first and second opposite ends separated along said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

at least one of said input and output electrode groups including first and second excitation parts spaced $n\lambda + \lambda/4$ apart from each other in the direction of said thickness of said multilayer piezoelectric ceramic;

bulk wave direction controlling means for enabling bulk waves produced by said first excitation part to propagate only in a direction opposite to said second excitation part;

alternate ones of said plurality of ceramic sheets on which said internal electrodes are formed being oppositely polarized along the direction of said thickness, alternate internal electrodes which follow one another in each said input and output electrode groups being led out respectively to respective first and second lateral sides of said ceramic body;

a first pair of external electrodes having first and second external contacts for contacting, respectively, said input internal electrodes which are led out at said first and second sides and a second pair of external electrodes having first and second external contacts for contacting, respectively, said output internal electrodes which are led out at said first and second sides; and means for applying a voltage to at least one of said input electrodes and producing an output at said output electrode group in response to vibrations which propagate from said input group to said output group.

6. A ceramic filter comprising:

a multi-layered piezoelectric ceramic body including a plurality of stacked ceramic sheets, said ceramic body having a thickness extending through said plurality of stacked sheets and first and second opposite ends separated along said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart, at least one of said input and output electrode groups being weighted;

alternate ones of said plurality of ceramic sheets on which said internal electrodes are formed being oppositely polarized along the direction of said thickness, alternate internal electrodes which follow one another in each said input and output electrode groups being led out respectively to respective first and second lateral sides of said ceramic body;

a first pair of external electrodes having first and second external contacts for contacting, respectively, said input internal electrodes which are led out at said first and second sides and a second pair of external electrodes having first and second external contacts for contacting, respectively, said output internal electrodes which are led out at said first and second sides; and means for applying a voltage to at least one of said input electrodes and producing an output at said output electrode group in response to vibrations which propagate from said input group to said output group.

7. A ceramic filter comprising:

a multi-layered piezoelectric ceramic body including a plurality of stacked ceramic sheets, said ceramic body having a thickness extending through said plurality of stacked sheets and first and second opposite ends separated along said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

each of said plurality of internal electrodes of said input and output electrode groups comprising a plurality of divisional electrodes having first and second adjoining electrodes at least partly opposed to a third electrode which adjoins said first and second electrodes through a ceramic layer, whereby a successive connection of said first electrode, piezoelectric ceramic layer, third electrode, piezoelectric layer, and the second electrode produces a series-connected capacitor forming portion;

said piezoelectric ceramic layers being polarized in the direction of said thickness, a portion of a given ceramic layer positioned between said first and third electrodes being polarized in an opposite direction from a portion positioned between said second and third electrodes;

a first pair of external electrodes having first and second external contacts for contacting, respectively, said input internal electrodes which are led out at said first and second sides and a second pair of external electrodes having first and second external contacts for contacting, respectively, said input internal electrodes which are led out at said first and second sides; and means for applying a voltage to at least one of said input electrodes and producing an output at said output electrode group in response to vibrations which propagate from said input group to said output group.

8. A ceramic filter as in claim 7, wherein said filter includes a first ceramic layer positioned adjacent said first end and a second ceramic layer positioned adjacent said second end and wherein the thickness of said first and second layers is selected to produce a predetermined center frequency.

9. A ceramic filter as in claim 7, wherein at least one of said internal electrodes of said input electrode group, is formed on said first end of said ceramic and at least one of said output internal electrodes is formed on said second end.

10. A ceramic filter as in claim 7, further comprising at, at least one of said first and second ends of said ceramic bulk wave eliminating means for eliminating bulk waves which produce spurious vibrations other than utilizable bulk waves.

11. A ceramic filter as in claim 7, wherein at least one of said input and output electrode groups comprises first and second excitation parts spaced $n\lambda + \lambda/4$ apart in the direction of said thickness of said multilayered piezoelectric ceramic, said filter further comprising bulk wave direction control means for enabling bulk waves produced by said first excitation part to propagate only in a direction opposite to said second excitation part.

12. A ceramic filter as in claim 7, wherein at least one of said input and output electrode groups is weighted.

13. A ceramic filter comprising:

a multi-layered piezoelectric ceramic body including a plurality of stacked ceramic sheets, said ceramic body having a thickness extending through said plurality of stacked sheets and first and second opposite ends separated along said thickness, said piezoelectric ceramic being polarized in a direction at right angles to the direction of said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

alternate internal electrodes which follow one another in each said input and output electrode groups being led out respectively to respective first and second lateral sides of said piezoelectric ceramic;

a first pair of external electrodes having first and second external contacts for contacting, respectively, said input internal electrodes which are led out at said first and second sides and a second pair of external electrodes having first and second external contacts for contacting respectively said output internal electrodes which are led out at said first and second sides;

bulk wave eliminating means for eliminating bulk waves which produce spurious vibrations other than utilizable bulk waves located at, at least one of said first and second ends of said ceramic; and means for applying a voltage to at least one of said input electrodes and producing an output at said output electrode group in response to vibrations which propagate from said input group to said output group.

14. A ceramic filter comprising:

a multi-layered piezoelectric ceramic body including a plurality of stacked ceramic sheets, said ceramic body having a thickness extending through said plurality of stacked sheets and first and second opposite ends separated along said thickness, said piezoelectric ceramic being polarized in a direction at right angles to the direction of said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

at least one of said input and output electrode groups comprising first and second excitation parts spaced $n\lambda + \lambda/4$ apart in the direction of said thickness of said multi-layered piezoelectric ceramic;

bulk wave direction control mans for enabling bulk waves produced by said first excitation part to propagate in a direction opposite to said second excitation part;

alternate internal electrodes which follow one another in each said input and output electrode groups being led out respectively to respective first and second lateral sides of said piezoelectric ceramic;

a first pair of external electrodes having first and second external contacts for contacting, respectively, said input internal electrodes which are led out at said first and second sides and a second pair of external electrodes having first and second external contacts for contacting respectively said output internal electrodes which are led out at said first and second sides; and means for applying a voltage to at least one of said input electrodes and producing an output at said output electrode group in response to vibrations which propagate from said input group to said output group.

15. A ceramic filter comprising:

a multi-layered piezoelectric ceramic body including a plurality of stacked ceramic sheets, said ceramic body having a thickness extending through said plurality of stacked sheets and first and second opposite ends separated along said thickness, said piezoelectric ceramic being polarized in a direction at right angles to the direction of said thickness;

an input electrode group including a plurality of internal input electrodes, at least one electrode being formed on each sheet of a selected group of said sheets lying adjacent said first end of said ceramic body, adjacent ones of said input electrodes overlapping each other along said thickness of said ceramic body;

an output electrode group including a plurality of internal output electrodes, at least one electrode being formed on each sheet of a selected group of said sheets lying adjacent said second end of said ceramic body, adjacent ones of said output electrodes overlapping each other along said thickness of said ceramic body, said input and output groups overlapping each other along said thickness and being spaced a predetermined distance apart;

alternate internal electrodes which follow one another in each said input and output electrode groups being led out respectively to respective first and second lateral sides of said piezoelectric ceramic, said alternate internal electrodes comprising alternate cavities which extend to the respective first and second lateral sides of said ceramic, and which are filled with molten metal after polarization; and a first pair of external electrodes having first and second external contacts for contacting, respectively, said input internal electrodes which are led out at said first and second sides and a second pair of external electrodes having first and second external contacts for contacting respectively said output internal electrodes which are led out at said first and second sides.

16. A method for forming cavities for a ceramic filter as in claim 15, the method including the steps of applying carbon paste to portions of ceramic green sheets where electrodes are to be formed, laminating the ceramic green sheets, and sintering the laminated ceramic green sheets so that the carbon burns out and said cavities are formed at positions where the layers of carbons were present.

17. A ceramic filter as in claim 15, further comprising at, at least one of said first and second ends of said ceramic bulk wave eliminating means for eliminating bulk waves which produce spurious vibrations other than utilizable bulk waves.

18. A ceramic filter as in claim 15, wherein at least one of said input and output electrode groups comprises first and second excitation parts spaced $n\lambda + \lambda/4$ apart in the direction of said thickness of said multi-layered piezoelectric ceramic, said filter further comprising bulk wave direction control means for enabling bulk waves produced by said first excitation part to propagate in a direction opposite to said second excitation part.

19. A ceramic filter as in claim 15, wherein at least one of said input and output electrode groups is weighted.

20. A ceramic filter as in claim 1, 4, 10, or 13, wherein said means for eliminating bulk waves comprises a plurality of grooves defined at least in one of said first and second ends of said ceramic, said grooves extending along the direction of said thickness of said ceramic and having a groove depth which is defined by the relation $2d=(n+\frac{1}{2})\lambda$ wherein n is the number of electrodes, $\lambda$ is the wave length of the bulk waves and d is the groove depth.

21. A ceramic filter as in claim 1, 4, 18, or 13, wherein said means for eliminating bulk waves comprises an inclined surface defined at least one of said first and second ends of said ceramic.

22. A ceramic filter as in claim 1, 4, 18 or 13, wherein said means for eliminating bulk waves comprises a spherical surface defined along at least one of said first and second ends.

23. A ceramic filter as in claim 3, 6, or 20, wherein said at least one input and output electrode groups is weighted by successively increasing the overlap between adjacent ones of said plurality of internal electrodes from said first and second ends of said ceramic toward the center of said ceramic body.

* * * * *